United States Patent [19]

Onodera et al.

[11] Patent Number: 5,606,738
[45] Date of Patent: Feb. 25, 1997

[54] FREQUENCY CONVERSION CIRCUIT WITH LINEAR FEEDBACK

[75] Inventors: Kiyomitsu Onodera; Masahiro Muraguchi, both of Kanagawa, Japan

[73] Assignee: Nippon Telegraph and Telephone Corp., Tokyo, Japan

[21] Appl. No.: 390,522

[22] Filed: Feb. 17, 1995

[30] Foreign Application Priority Data

Feb. 24, 1994 [JP] Japan .................................. 6-026748
Mar. 29, 1994 [JP] Japan .................................. 6-059209

[51] Int. Cl.$^6$ ........................................ H04B 1/28
[52] U.S. Cl. ....................... 455/333; 327/358; 327/363
[58] Field of Search ............................ 455/313, 323–325, 455/330, 333; 327/355, 358, 363, 408, 411

[56] References Cited

U.S. PATENT DOCUMENTS 5,083,050  1/1992  Vasile .................................. 455/333 X
5,465,415  11/1995  Bien .................................... 455/333 X
5,465,420  11/1995  Dougherty et al. ....................... 455/333

FOREIGN PATENT DOCUMENTS 3-175704  7/1991  Japan .................................. 455/333

OTHER PUBLICATIONS

"A GaAs MESFET Mixer with Very Low Intermodulation", Maas, IEEE Transactions on Microwave Theory and Techniques, vol. MTT–35, No. 4, Apr. 1987, pp. 425–429.
"An Unusual Microwave Mixer", Tomassetti, Proc. 16th Microwave Conf., 1987, pp. 754–759.

Primary Examiner—Chi H. Pham
Attorney, Agent, or Firm—Nikaido, Marmelstein, Murray & Oram LLP

[57] ABSTRACT

A frequency conversion circuit having at least one transistor with an input terminal and an output terminal. A frequency signal to be converted or a local oscillator (LO) signal is input to the input terminal, and a converted frequency signal is output from the output terminal. A linear feedback circuit allowing at least a radio frequency (RF) signal and the LO signal to feed back is directly connected across the input and output terminals.

22 Claims, 18 Drawing Sheets

FREQUENCY CONVERSION CIRCUIT WITH LINEAR FEEDBACK

BACKGROUND OF THE INVENTION

1. Field of the Invention

The present invention relates to a frequency conversion circuit which constitutes an essential stage of a transmitter and of a receiver in a radio communication device.

2. Description of the Related Art

In a field of the personal communication wherein the number of subscribers will rapidly increase, it is requested to develop a frequency conversion circuit with improved linear property, as soon as possible. Generally, the intermodulation distortion (IM) property of a receiver front end is limited by that of the mixer having worse IM property than the other stages in the receiver. Therefore, improving the mixer's IM property can do much to improve the whole IM property of the receiver front end and also to improve dynamic range.

A drain LO injection mixer is known as a mixer having relatively good IM property and is described for example in "An Unusual Microwave Mixer", by G. Tomasetti, Proc. 16th Microwave Conf., 754, (1987). According to this mixer, the LO (Local Oscillator) signal and the IF (Intermediate Frequency) signal are fed to and taken from the drain of the GaAs FET while the RF (Radio Frequency) signal is fed to the gate of this FET.

The input impedance of the FET in this mixer almost depends upon the gate-source capacitance when this mixer is used at the mobile communication frequency of around 1 GHz. For example, in case of the GaAs FET with the gate width of 100 μm, the input impedance depending upon the gate-source capacitance will be about 2 kΩ (kilo-ohms order). Since the gate voltage amplitude of the FET is determined only by its threshold voltage and by its Schottky gate voltage, dynamic range for RF signal will be narrowed if the input impedance is great, resulting the IM property to be extremely made worse than that at several tens GHz.

The most commonly used method for broadening the dynamic range is to reduce the input signal level to the mixer. However, this reduction of the input signal level will result a low level output signal from the mixer causing a heavy burden to an amplifier in the following stage. Another method for broadening the dynamic range is to increase the gate width of the FET so as to reduce its input impedance. However, this latter method also has problems as that the conversion gain decreases by 3 dB and double DC power will be consumed at the FET if its gate width is doubled. In order to compensate the decreasing conversion gain, it is necessary to increase the LO signal level to the drain.

A resistive mixer has been employed for suppressing IM as described in "A GaAs MESFET Mixer with Very Low Intermodulation", by S. A. Mass, IEEE Trans. MTT, Vol.35, 425 (1987). According to this mixer, a small RF signal is fed to the drain of the FET and a large LO signal is fed to its gate, and then the LO signal modulates the junction conductance at the LO frequency by using a switching operation of the FET. Since the channel resistance of this FET is substantially linear, the IM can be suppressed enough. However, because the FET operates only in the linear region with no amplifying operation, this resistive mixer provides a very small conversion gain and a poor noise property.

As aforementioned, the conventional frequency conversion circuits have sacrificed the conversion gain (or output frequency signal power) and the noise figure for improvement of the IM property.

SUMMARY OF THE INVENTION

It is therefore an object of the present invention to provide a frequency conversion circuit which can extremely improve the IM property without reducing conversion gain and noise figure.

According to the present invention, a frequency conversion circuit having at least one transistor with an input terminal and an output terminal is constituted as that one of a frequency signal to be converted and of a LO signal is inputted to the input terminal and a converted frequency signal is output from the output terminal. A linear feedback circuit allowing at least an RF signal and the LO signal to feed back is directly connected across the input and output terminals.

It is preferred that the frequency conversion circuit includes a single FET with a gate electrode operating as the input terminal and a drain electrode operating as the output terminal, and that the linear feedback circuit is directly connected across the gate and drain electrodes.

The frequency signal to be converted may be an RF signal and the converted frequency signal may be an IF signal.

In this case, it is preferred that the RF signal is input to the gate electrode and the LO signal is inputted to the drain electrode, that the FET has a source electrode and the LO signal is input to the source electrode, that the RF signal is input to the drain electrode and the LO signal is input to the gate electrode, or that the frequency conversion circuit further includes a composite circuit coupled to the gate electrode and the RF signal and the LO signal are input to the gate electrode via the composite circuit.

The frequency signal to be converted may be an IF signal and the converted frequency signal may be an RF signal.

In this case, it is preferred that the IF signal is input to the gate electrode, that the LO signal is inputted to the gate electrode, or that the frequency conversion circuit further includes a composite circuit coupled to the gate electrode and the IF signal and the LO signal are input to the gate electrode via the composite circuit.

In an embodiment, the frequency conversion circuit may include a single bipolar transistor with a base electrode operating as the input terminal and a collector electrode operating as the output terminal, and the linear feedback circuit is directly connected across the base and collector electrodes.

Preferably, the frequency conversion circuit includes two FETs connected with each other in series. Each of the FETs has a gate electrode and a drain electrode. The frequency signal to be converted is input to the gate electrode of one of the FETs and the local oscillator signal is input to the gate electrode of the other one of the FETs. The linear feedback circuit is directly connected across the gate electrode of one of the FETs and the drain electrode of one of the FETs.

In this case, the frequency signal to be converted may be an RF signal and the converted frequency signal may be an IF signal, or the frequency signal to be converted may be an IF signal and the converted frequency signal may be an RF signal.

In an embodiment, the frequency conversion circuit may include a single dual gate FET with two gate electrodes and a drain electrode. The frequency signal to be converted will be input to one of the gate electrodes and the LO signal will be input to the other one of the gate electrodes. The linear feedback circuit is directly connected across the drain electrode and one of the gate electrodes.

The frequency conversion circuit may include two bipolar transistors connected with each other in series. Each of the bipolar transistors has a base electrode and a collector electrode. The frequency signal to be converted is input to the base electrode of one of the bipolar transistors and the LO signal is input to the base electrode of the other one of the bipolar transistors. The linear feedback circuit is directly connected across the base electrode of one of the bipolar transistors and the collector electrode of one of the bipolar transistors.

As will be apparent from the above-description, the frequency conversion circuit according to the present invention concerns a mixer circuit with at least one transistor receiving the RF and LO signals and outputting the IF signal, and an up-converter circuit with at least one transistor receiving the IF and LO signals and outputting the RF signal. Particularly, according to the present invention, a linear feedback circuit allowing at least the RF signal and the LO signal to feed back is directly connected across the gate (base) and the drain (collector) of the transistor.

The frequency conversion circuit according to the present invention differs from the conventional conversion circuit in a direct connection of such the linear feedback circuit to the gate (base) and the drain (collector) of the transistor. Namely, even in the conversion circuit of the invention, the distortion component is canceled each other by the phase feedback as well as a general negative feedback amplifier. However, it should be noted that the conversion circuit of the present invention feeds back at least the RF signal and the LO signal. The feedback of only the IF signal cannot be expected to improve the distortion property, but the feedback of the RF and LO signals can remarkably improve the distortion property.

The frequency conversion circuit of drain LO injection type has further advantage of attaining a higher conversion gain than the conventional conversion circuit. This is because, by additionally connecting the signal feedback circuit, the gate and the drain can be easily matched so that the LO signal can be effectively inputted into the transistor. In the frequency conversion circuit of gate LO injection type, since the gate operates as a substantially ideal switch, the LO signal cannot be effectively input into the transistor causing the conversion gain to decrease due to the feedback.

The linear feedback circuit according to the present invention preferably includes a series circuit of a capacitor and a resistor. The resistor may be a fixed resistance resistor or a variable resistance resistor. The linear feedback circuit may include an inductor or a capacitor connected with the series circuit of a capacitor and a resistor in series.

Further objects and advantages of the present invention will be apparent from the following description of the preferred embodiments of the invention as illustrated in the accompanying drawings.

DESCRIPTION OF THE PREFERRED EMBODIMENTS

Figure 1:
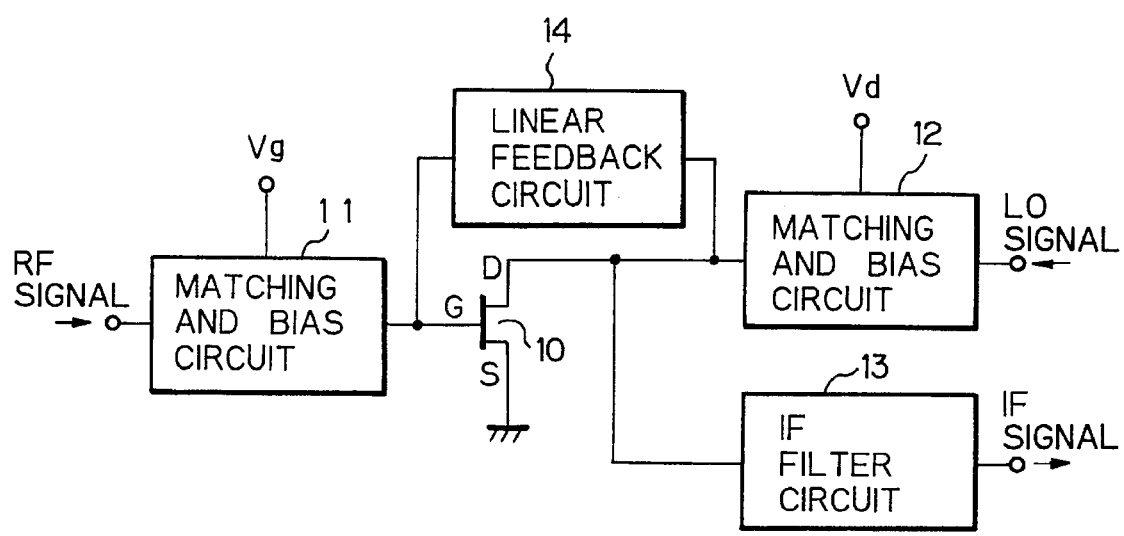
FIG. 1 schematically shows a preferred embodiment of a frequency conversion circuit according to the present invention.

FIG. 1 schematically shows a preferred embodiment of a frequency conversion circuit according to the present invention. The frequency conversion circuit in this embodiment is a drain LO injection GaAs FET mixer receiving the RF signal at its gate as a frequency signal to be converted, mixing the LO signal injected into its drain with the RF signal and outputting the IF signal from the drain as a frequency converted signal.

In FIG. 1, a reference numeral 10 denotes a GaAs FET with a grounded source electrode. A matching and bias circuit 11 is connected with a gate electrode of the transistor 10. The RF signal is input into the transistor 10 through this circuit 11. Another matching and bias circuit 12 is connected with a drain electrode of the transistor 10. The LO signal is input into the drain electrode of the transistor 10 through this circuit 12 and mixed with the RF signal to obtain the IF signal. An IF filter circuit 13 for passing the IF signal but for preventing the RF and LO signals is also connected to the drain electrode. Thus, the obtained IF signal is output from the drain electrode of the transistor 10 through this circuit 13.

A linear feedback circuit 14 for feeding back not only the IF signal but also the RF and LO signals is directly connected across the drain electrode and the gate electrode of the transistor 10. The linear feedback circuit 14 in this embodiment is RC feedback constituted by a capacitor 14a and a resistor 14b connected with each other in series as shown in FIG. 2.

In this embodiment, the source electrode of the transistor 10 is directly grounded. However, in a modification, the source electrode may be indirectly grounded via a circuit element such as an inductor, capacitor or a level shift diode.

Figure 2:
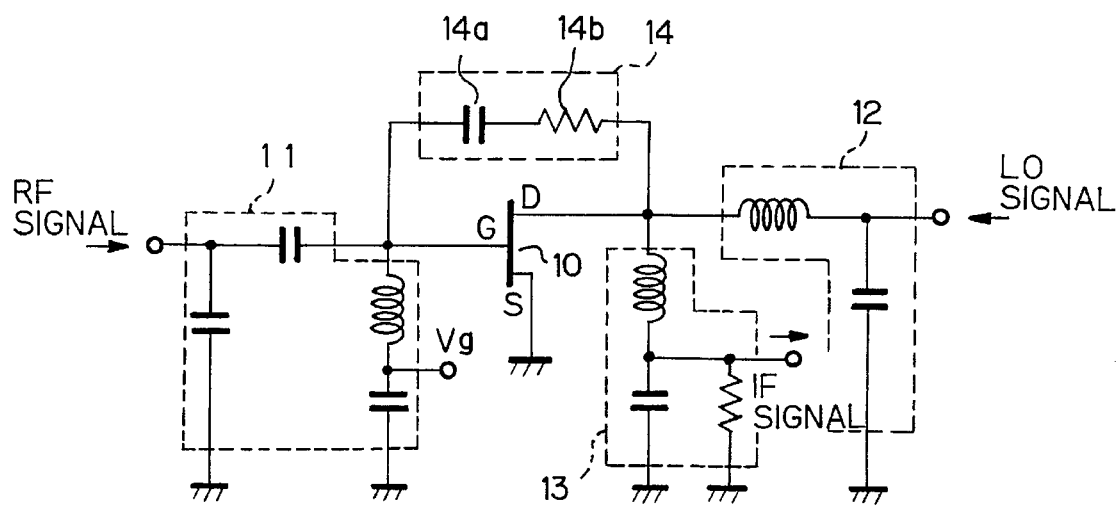
FIG. 2 shows a concrete example of the circuit according to the embodiment shown in FIG. 1.

FIG. 2 shows a circuit structure example of the embodiment shown in FIG. 1. In this example, the drain electrode is grounded by high resistor to avoid dc power dissipated. The transistor 10 is for example a GaAs MESFET with a threshold voltage of −1 V, a gate width of 400 μm and a gate length of 0.3 μm.

Figure 3:
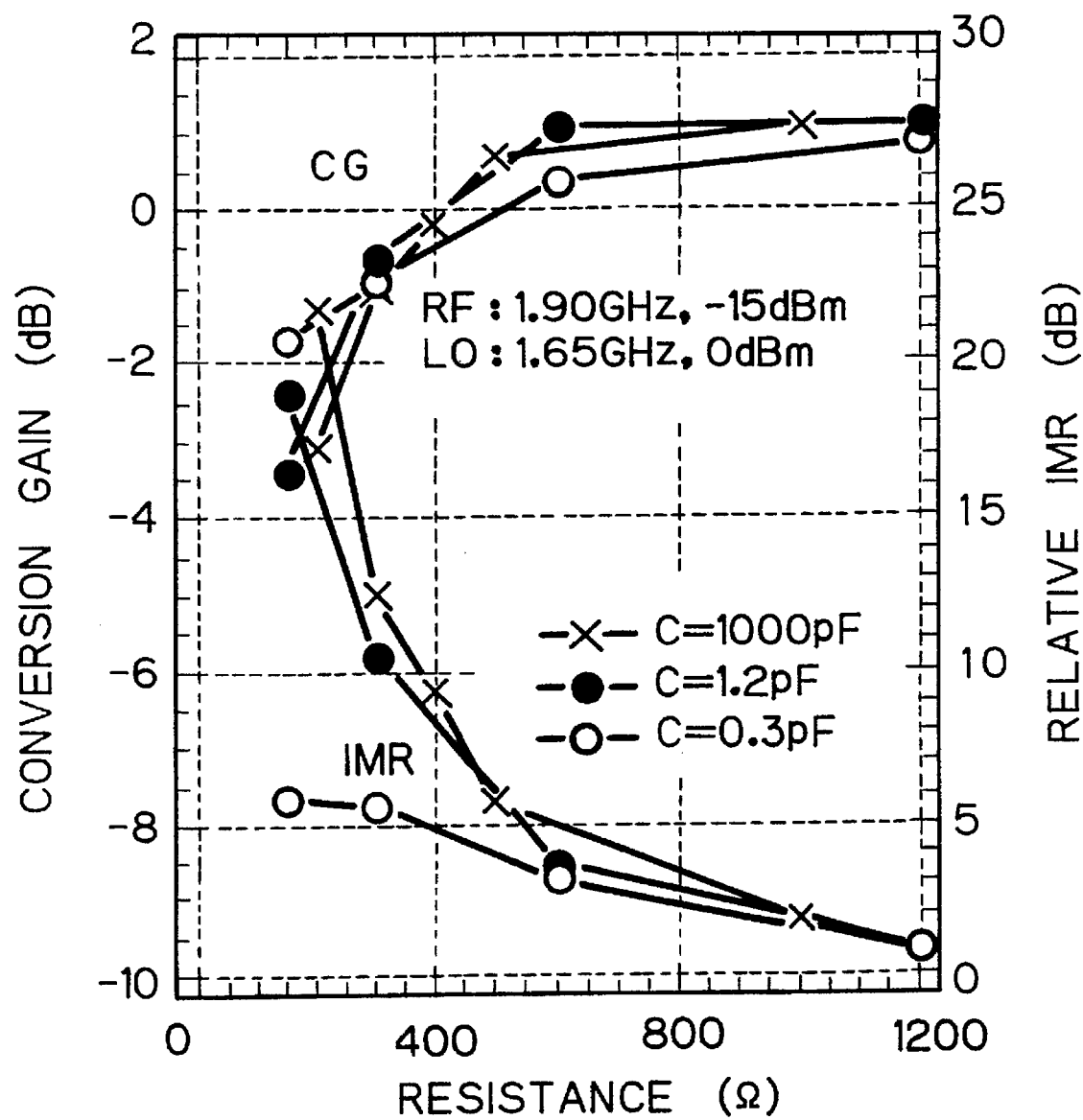
FIG. 3 shows a simulated conversion gain property and a simulated third-order intermodulation distortion ratio (IMR) property relative to that of no-feedback case, according to the embodiment shown in FIG. 1 compared to a conventional mixer.

FIG. 3 shows a simulated conversion gain (CG) property and a simulated third-order intermodulation distortion ratio (IMR) property relative to that of no-feedback case, of the mixer according to this embodiment compared to a conventional mixer. For the simulation, it is supposed that the RF signal frequency is 1.9 GHz, the RF power level is −15 dB, the LO signal frequency is 1.65 GHz, the LO power level is 0 dB, and the bias is kept constant.

For lower feedback resistance, the relative IMR continues to improve with feedback capacitance of 1.2 pF or 1000 pF while it is almost constant with 0.3 pF. Therefore, capacitance of greater than 1 pF is necessary for lowering the IMR. Furthermore, if the LO power level at the drain is increased more than 3 dBm, particularly more than 5 dBm, a better linearity can be obtained resulting a more remarkable improvement of the third-order IM property without conversion gain fall off can be expected.

Figure 4:
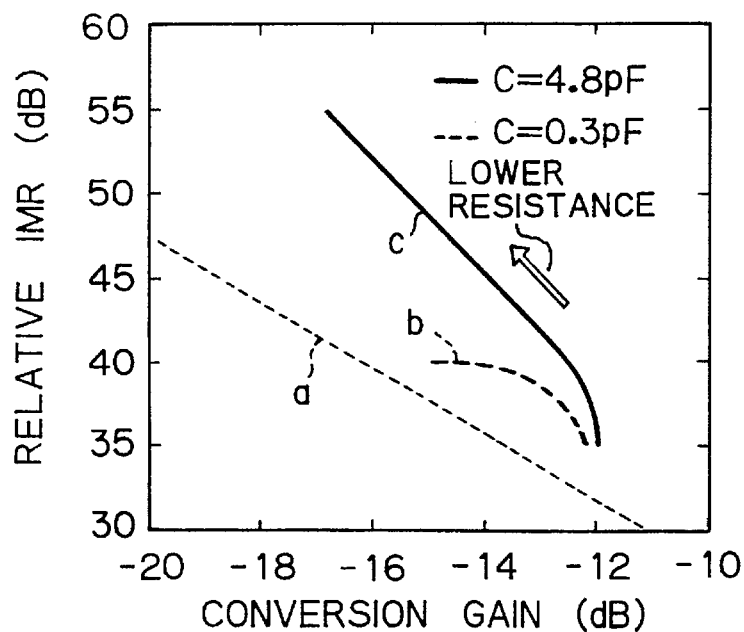
FIG. 4 shows the simulated result of FIG. 3 illustrating in a relationship of the relative IMR versus the conversion gain.

FIG. 4 shows the simulated result of FIG. 3 illustrating in a relationship of the relative IMR versus the conversion gain. In this figure, however, the relationship is represented in cases of no-feedback, and of feedback with capacitance of 4.8 pF and of 0.3 pF.

As shown by a linear broken line a in FIG. 4, the conventional mixer has poor conversion gain because the dynamic range is broadened by increasing the gate width of the transistor without using a feedback circuit. However, as shown by a solid line c, the mixer, according to this embodiment with the linear feedback circuit can improve the relative IMR by 10 dB than the conventional mixer which has the same conversion gain. A broken line b in FIG. 4 shows the characteristics of the mixer with feedback capacitance of 0.3 pF which is less than 1 pF.

Figure 5:
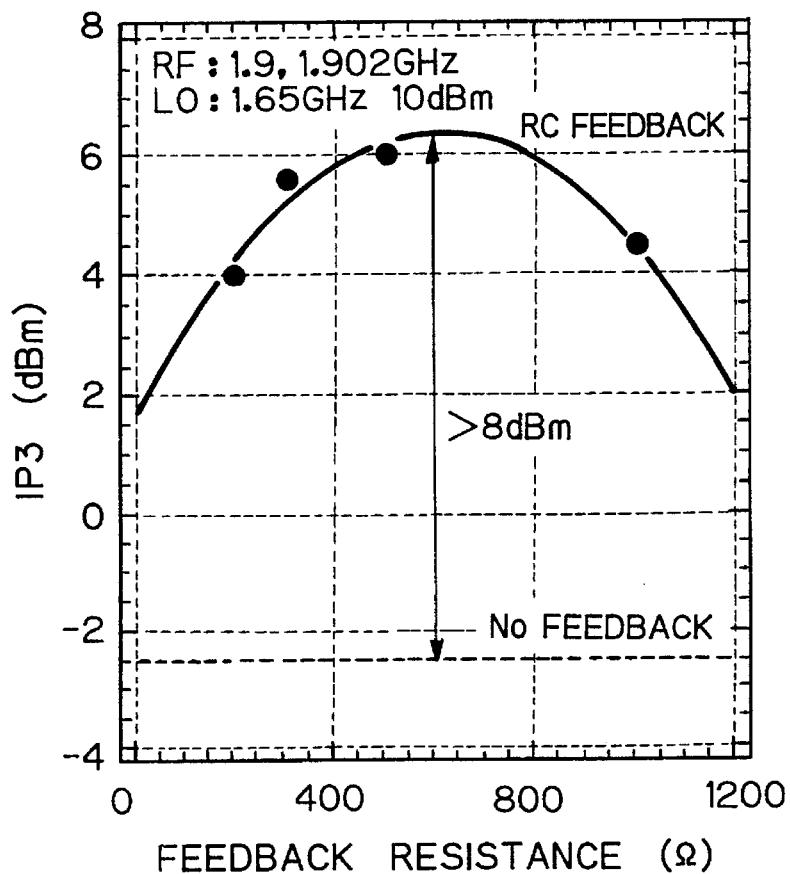
FIG. 5 shows a measured third-order intermodulation intercept point (IP3) versus feedback resistance property according to the embodiment shown in FIG. 1.

FIG. 5 shows a measured third-order intermodulation intercept point (IP3) versus feedback resistance property of the mixer according to this embodiment. In this measurement, the RF signal frequency is 1.9 or 1.902 GHz, the RF power level is −15 dB, the LO signal frequency is 1.65 GHz, the LO power level is 10 dB, and the bias is kept constant.

As is known, a better IM property can be obtained with greater IP3 which will depend upon the feedback resistance. As is apparent from FIG. 5, the mixer according to this embodiment with optimum feedback resistance of 500 to 700Ω particularly of about 600Ω will offer more than 8 dBm improvement in IP3 in comparison with the conventional mixer with no-feedback.

Figure 6:
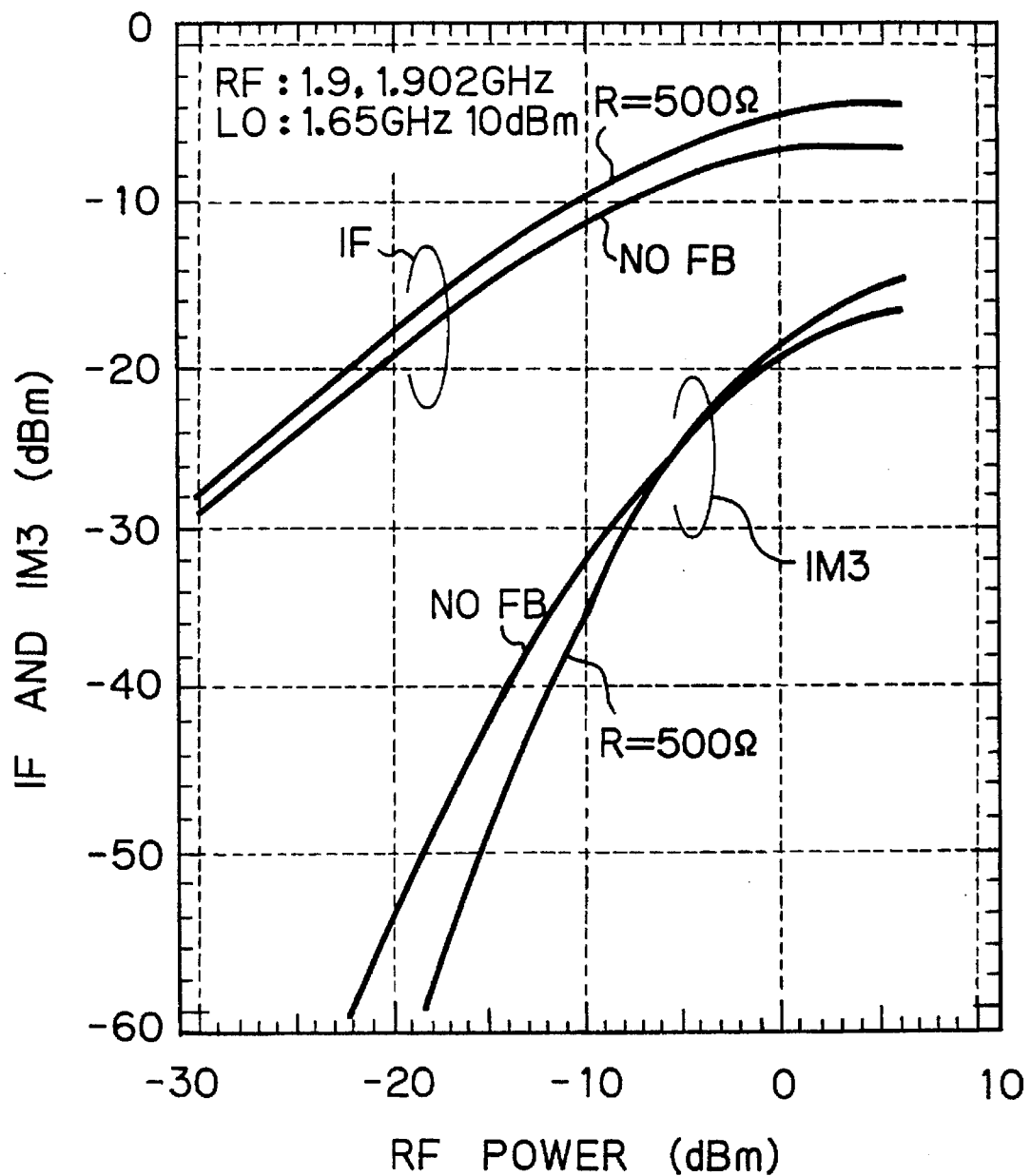
FIG. 6 shows a measured IF power and third-order IM power versus RF input power property according to the embodiment shown in FIG. 1.

FIG. 6 shows a measured IF power and third-order IM (IM3) power versus RF input power property with and without RC feedback according to this embodiment. The feedback resistance is 500Ω, the RF signal frequency is 1.9 or 1.902 GHz, the LO signal frequency is 1.65 GHz, and the LO power level is 10 dBm. The linearity can be extremely improved when the feedback resistance is 500Ω.

It is apparent from FIG. 6 that IP3 with the RC feedback is 6 dBm and IP3 without feedback is −2.5 dBm. Namely, the mixer with the RC feedback with the optimum feedback resistance can attain extremely lower IM3 and higher IF power than these of the conventional mixer without feedback, resulting more than 8 dBm improvement in IP3. It should be noted that, according to the invention, both the linearity and the conversion gain are improved, which could not be attained by the conventional mixer.

Figure 7A:
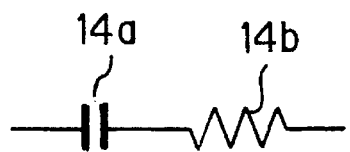
FIGS. 7a to 7f illustrate various constitution examples of a linear feedback circuit.
Figure 7B:
Figure 7C:
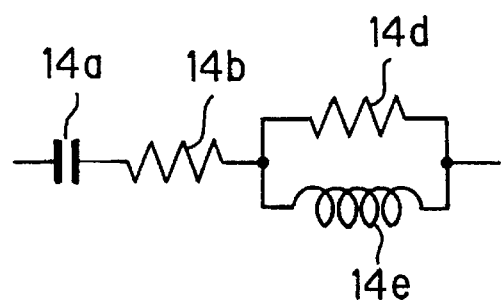
Figure 7D:
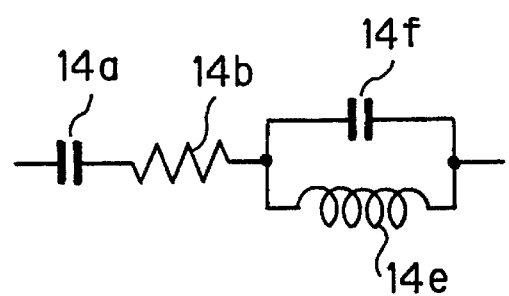
Figure 7E:
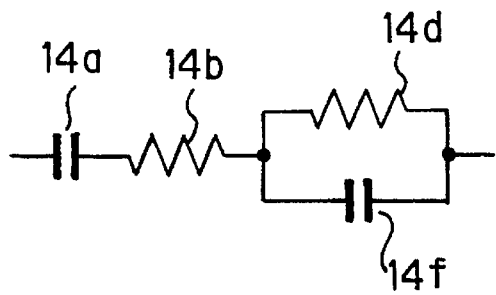
Figure 7F:
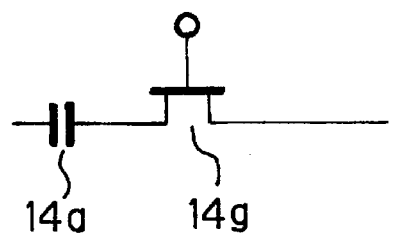

FIGS. 7a to 7f illustrate various constitution examples of the linear feedback circuit. The mixer of the embodiment of FIG. 1 uses the linear feedback circuit 14 shown in FIG. 7a and constituted by the capacitor 14a and the resistor 14b connected with each other in series. The frequency conversion circuit according to the present invention, however, may use a linear feedback circuit with a capacitor 14a, a resistor 14b and an inductor connected with each other in series as shown in FIG. 7b, a linear feedback circuit with a series circuit of a capacitor 14a and a resistor 14b, and with a parallel circuit of a resistor 14d and an inductor 14e, connected to the series circuit in series as shown in FIG. 7c, a linear feedback circuit with a series circuit of a capacitor 14a and a resistor 14b, and with a parallel circuit of a capacitor 14f and an inductor 14e, connected to the series circuit in series as shown in FIG. 7d, a linear feedback circuit with a series circuit of a capacitor 14a and a resistor 14b, and with a parallel circuit of a resistor 14d and a capacitor 14f, connected to the series circuit in series as shown in FIG. 7e, or a linear feedback circuit with a series circuit of a capacitor 14a and a varistor 14g operated as a variable resistor by slightly adjusting the gate voltage of a transistor as shown in FIG. 7f.

Figure 8:
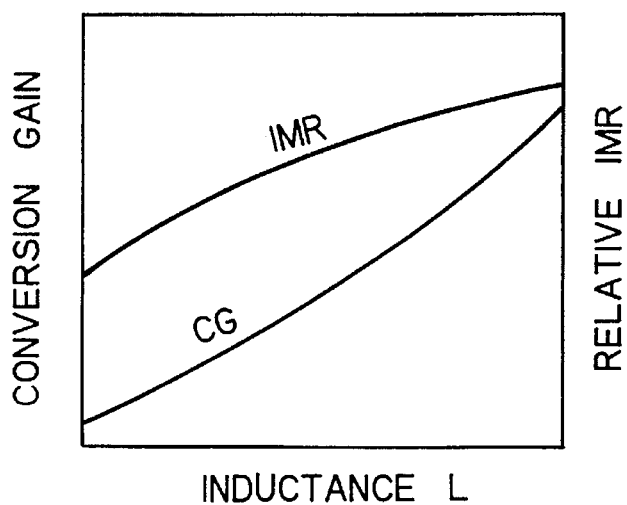
FIG. 8 shows simulated conversion gain and relative IMR versus inductance properties of the frequency conversion circuit using the feedback circuit shown in FIG. 7b.
Figure 9:
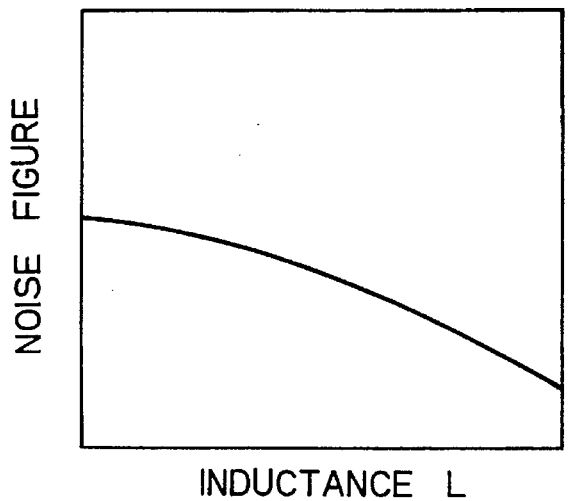
FIG. 9 shows simulated noise figure versus inductance property of the frequency conversion circuit using the feedback circuit shown in FIG. 7b.

FIGS. 8 and 9 show simulated conversion gain and relative IMR versus inductance properties and simulated noise figure versus inductance property of the frequency conversion circuit using the linear feedback circuit shown in FIG. 7b, respectively. For the simulation, it is supposed that the RF signal frequency is 1.9 GHz, the RF power level is −15 dB, the LO signal frequency is 1.65 GHz, the LO power level is 0 dB, and the bias is kept constant. The feedback capacitance is 4.8 pF and the feedback resistance is 600Ω.

As shown in FIG. 8, for higher inductance L, both the conversion gain and the relative IMR are improved and a better IMR property than that of the feedback circuit of FIG. 7a can be obtained. Furthermore, for higher inductance L, the noise figure decreases as shown in FIG. 9.

Figure 10:
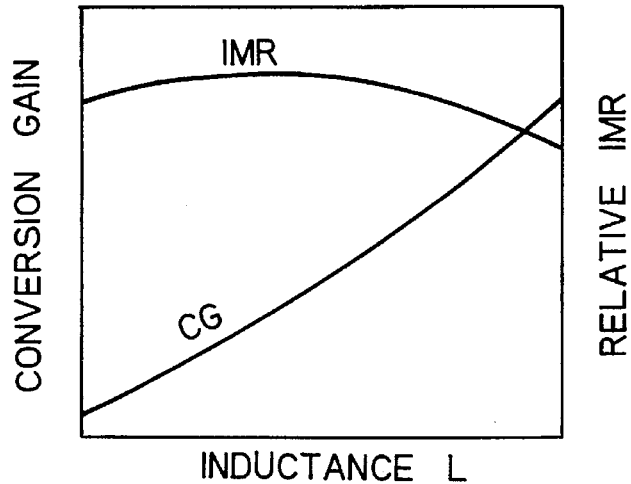
FIG. 10 shows simulated conversion gain and relative IMR versus inductance properties of the frequency conversion circuit using the feedback circuit shown in FIG. 7c.

FIG. 10 shows simulated conversion gain and relative IMR versus inductance properties of the frequency conversion circuit using the linear feedback circuit shown in FIG. 7c. For the simulation, it is supposed that the RF signal frequency is 1.9 GHz, the RF power level is −15 dB, the LO signal frequency is 1.65 GHz, the LO power level is 0 dB, and the bias is kept constant. The feedback capacitance is 4.8 pF and the feedback resistance of the resistor 14b and 14d is 600Ω.

For higher inductance L, the conversion gain increases while the relative IMR is almost constant. Therefore, for the same conversion gain, a better IMR property than that of the feedback circuit of FIG. 7a can be obtained. Furthermore, although not shown, for higher inductance L, the noise figure decreases.

The linear feedback circuit shown in FIG. 7c can adjust the relative feedback amount and the relative phase of the RF, LO and IF signals by controlling the resistance and the inductance of the parallel circuit of the resistor 14d and the inductor 14e, which operate as a filter, so as to improve both the conversion gain and the relative IMR.

The linear feedback circuit shown in FIG. 7d can also improve the conversion gain and the relative IMR together by appropriately adjusting the capacitance and the inductance of the parallel circuit of the capacitor 14f and the inductor 14e.

The linear feedback circuit shown in FIG. 7e can also improve the conversion gain and the relative IMR together by appropriately adjusting the capacitance and the resistance of the parallel circuit of the capacitor 14f and the resistor 14d.

Figure 11:
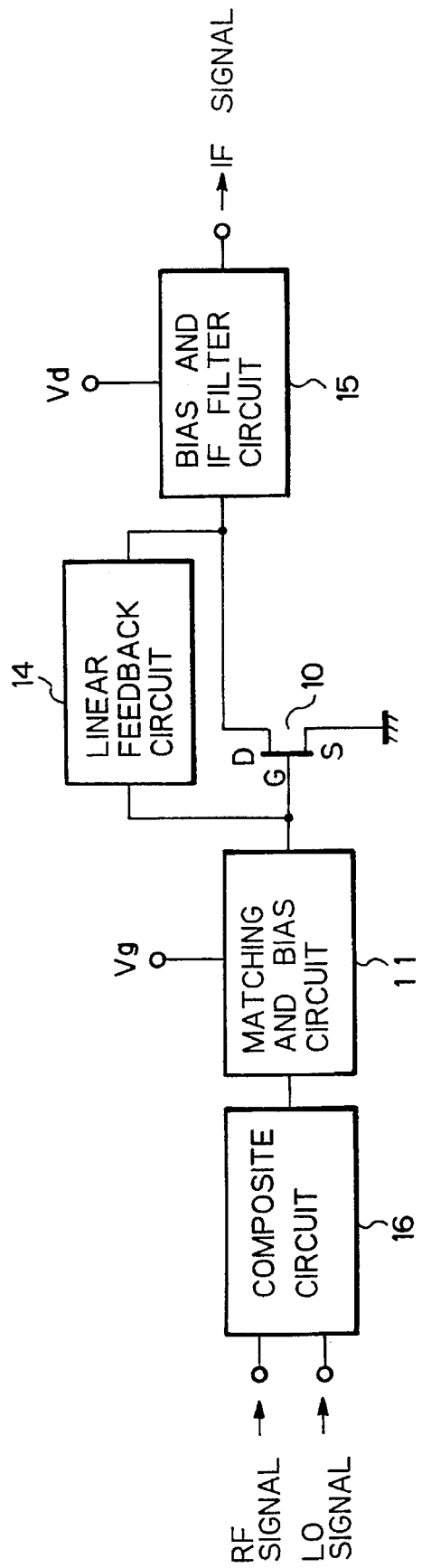
FIG. 11 schematically another embodiment of a frequency conversion circuit according to the present invention.

FIG. 11 schematically shows an another embodiment of a frequency conversion circuit according to the present invention. The frequency conversion circuit of this embodiment is a gate LO injection GaAs FET mixer receiving the RF signal at its gate as a frequency signal to be converted, mixing the LO signal injected into the same gate with the RF signal and outputting the IF signal from a drain as a frequency converted signal. In FIG. 11, the same references are used for the same components as these in FIG. 1.

A matching and bias circuit 11 is connected to a gate electrode of a GaAs FET 10 having a grounded source electrode. A composite circuit 16 which can be constituted by a LANGE coupler or by an Wilkinson divider is connected to this circuit 11. The RF and LO signals are coupled by the composite circuit 16 and then input into the gate electrode of the transistor 10 through this circuit 11. Thus, the LO signal is mixed with the RF signal to obtain the IF signal. A bias and IF filter circuit 15 is connected to a drain electrode of the transistor 10. The obtained IF signal is output from the drain electrode of the transistor 10 through this circuit 15.

A linear feedback circuit 14 for feeding back not only the IF signal but also the RF and LO signals is directly connected across the drain electrode and the gate electrode of the transistor 10. The linear feedback circuit 14 in this embodiment can be constituted by any one of the various circuits shown in FIGS. 7a to 7f.

In this embodiment, the source electrode of the transistor 10 is directly grounded. However, in a modification, the source electrode may be indirectly grounded via a circuit element such as an inductor, capacitor or a level shift diode.

Due to the linear feedback circuit for feeding back not only the IF signal but also the RF and LO signals, the frequency conversion circuit of this embodiment can improve the relative IHR by 10 dB for the same conversion gain than that in the conventional mixer.

Figure 12:
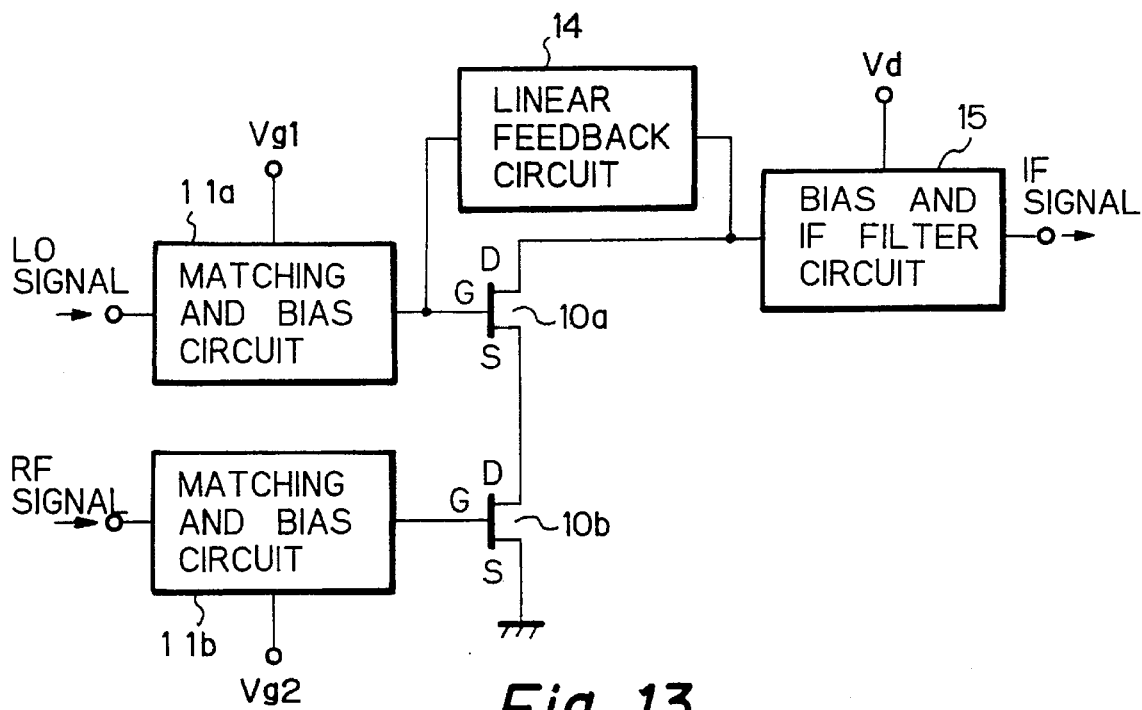
FIG. 12 schematically shows a further embodiment of a frequency conversion circuit according to the present invention.

FIG. 12 schematically shows a further embodiment of a frequency conversion circuit according to the present invention. The frequency conversion circuit of this embodiment is a gate LO injection GaAs FET mixer receiving the RF signal at a gate of a second GaAs FET as a frequency signal to be converted, mixing the LO signal injected into a gate of a first GaAs FET with the RF signal, and outputting the IF signal from a drain of the first FET as a frequency converted signal. In FIG. 12, the same references are used for the same components as these in FIGS. 1 and 11.

The first and second GaAs FETs 10a and 10b are connected with each other in series. Namely, a source electrode of the first transistor 10a is connected to a drain electrode of the second transistor 10b. A source electrode of the second transistor 10b is grounded. The gate electrode of this second transistor 10b is connected to a second matching and bias circuit 11b and receives the RF signal through this circuit 11b. The gate electrode of the first transistor 10a is connected to a first matching and bias circuit 11a and receives the LO signal through this circuit 11a. Thus, the LO signal is mixed with the RF signal to obtain the IF signal. A bias and IF filter circuit 15 is connected to a drain electrode of the first transistor 10a. The obtained IF signal is output from the drain electrode of the first transistor 10a through this circuit 15.

A linear feedback circuit 14 for feeding back not only the IF signal but also the RF and LO signals is directly connected across the drain electrode of the first transistor 10a and its gate electrode. The linear feedback circuit 14 in this embodiment can be constituted by any one of the various circuits shown in FIGS. 7a to 7f.

In this embodiment, the source electrode of the second transistor 10b is directly grounded. However, in a modification, the source electrode may be indirectly grounded via a circuit element such as an inductor, capacitor or a level shift diode.

The frequency conversion circuit of this embodiment executes feedback operation with respect to the LO signal so as to improve a linearity of this LO signal causing the IM distortion to decrease. Due to such the linear feedback circuit 14 for feeding back not only the IF signal but also the RF and LO signals, the conversion circuit of this embodiment can improve the relative IMR by 10 dB for the same conversion gain than that in the conventional mixer.

Figure 13:
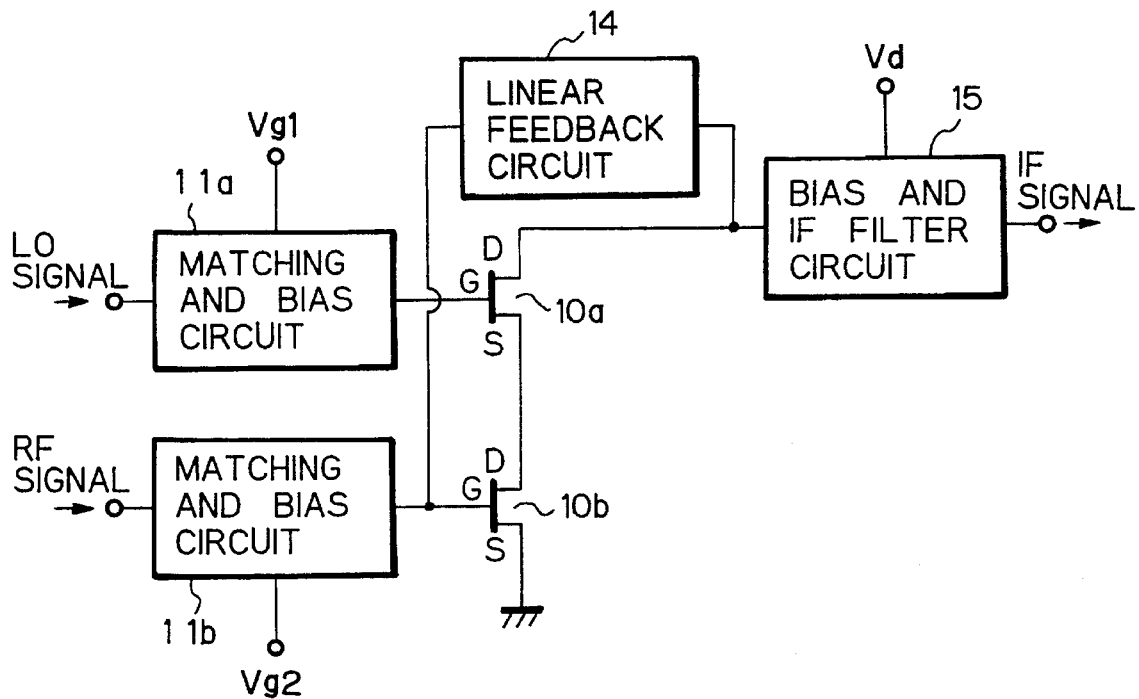
FIG. 13 schematically shows a still further embodiment of a frequency conversion circuit according to the present invention.

FIG. 13 schematically shows a still further embodiment of a frequency conversion circuit according to the present invention. The constitution of this frequency conversion circuit is the same as that of FIG. 12 except that the feedback operation is executed with respect to the RF signal instead of the LO signal. Namely, according to this embodiment, a linear feedback circuit 14 is directly connected across the drain electrode of the first transistor 10a and the gate electrode of the second transistor 10b so as to improve a linearity of the RF signal causing the IM distortion to decrease.

Due to such the linear feedback circuit 14 for feeding back not only the IF signal but also the RF and LO signals, the conversion circuit of this embodiment also can improve the relative IMR by 10 dB for the same conversion gain than that in the conventional mixer.

Figure 14:
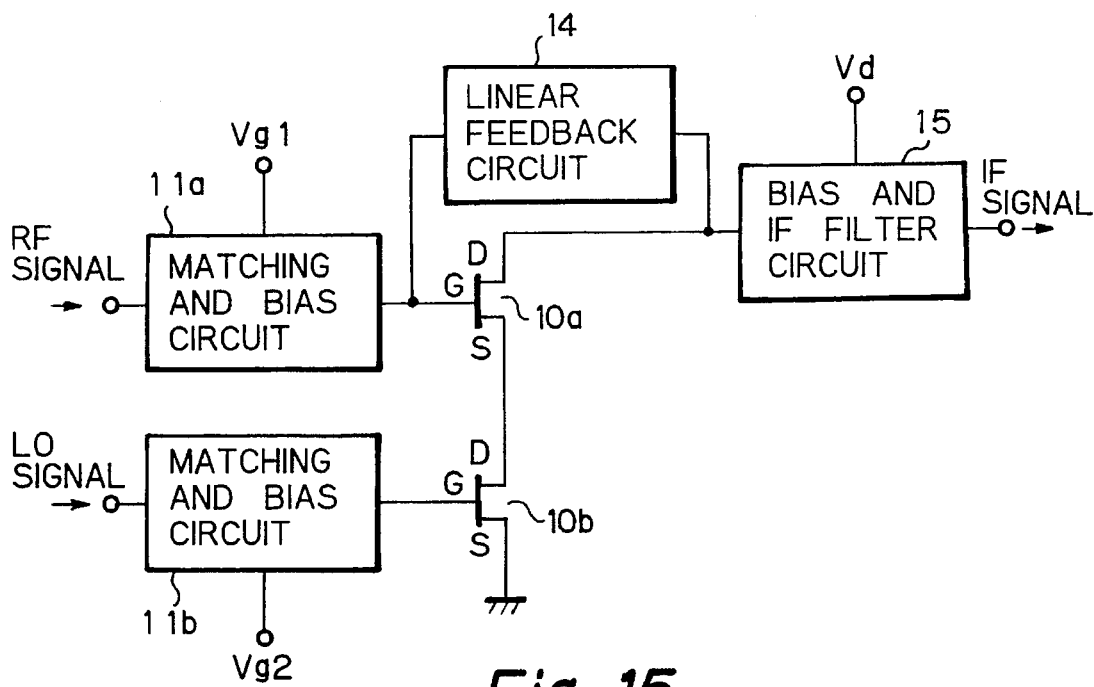
FIG. 14 schematically shows another embodiment of a frequency conversion circuit according to the present invention.

FIG. 14 schematically shows an another embodiment of a frequency conversion circuit according to the present invention. The frequency conversion circuit of this embodiment is a gate LO injection GaAs FET mixer receiving the RF signal at a gate of a first GaAs FET as a frequency signal to be converted, mixing the LO signal injected into a gate of a second GaAs FET with the RF signal, and outputting the IF signal from a drain of the first FET as a frequency converted signal. In FIG. 14, the same references are used for the same components as these in FIGS. 1 and 12.

The first and second GaAs FETs 10a and 10b are connected with each other in series. Namely, a source electrode of the first transistor 10a is connected to a drain electrode of the second transistor 10b. A source electrode of the second transistor 10b is grounded. The gate electrode of this second transistor 10b is connected to a second matching and bias circuit 11b and receives the LO signal through this circuit 11b. The gate electrode of the first transistor 10a is connected to a first matching and bias circuit 11a and receives the RF signal through this circuit 11a. Thus, the LO signal is mixed with the RF signal to obtain the IF signal. A bias and IF filter circuit 15 is connected to a drain electrode of the first transistor 10a. The obtained IF signal is output from the drain electrode of the first transistor 10a through this circuit 15.

A linear feedback circuit 14 for feeding back not only the IF signal but also the RF and LO signals is directly connected across the drain electrode of the first transistor 10a and its gate electrode. The linear feedback circuit 14 in this embodiment can be constituted by any one of the various circuits shown in FIGS. 7a to 7f.

In this embodiment, the source electrode of the second transistor 10b is directly grounded. However, in a modification, the source electrode may be indirectly grounded via a circuit element such as an inductor, capacitor or a level shift diode.

The frequency conversion circuit of this embodiment executes feedback operation with respect to the RF signal so as to improve a linearity of this RF signal causing the IM distortion to decrease. Due to such the linear feedback circuit 14 for feeding back not only the IF signal but also the RF and LO signals, the conversion circuit of this embodiment can improve the relative IMR by 10 dB for the same conversion gain than that in the conventional mixer.

Figure 15:
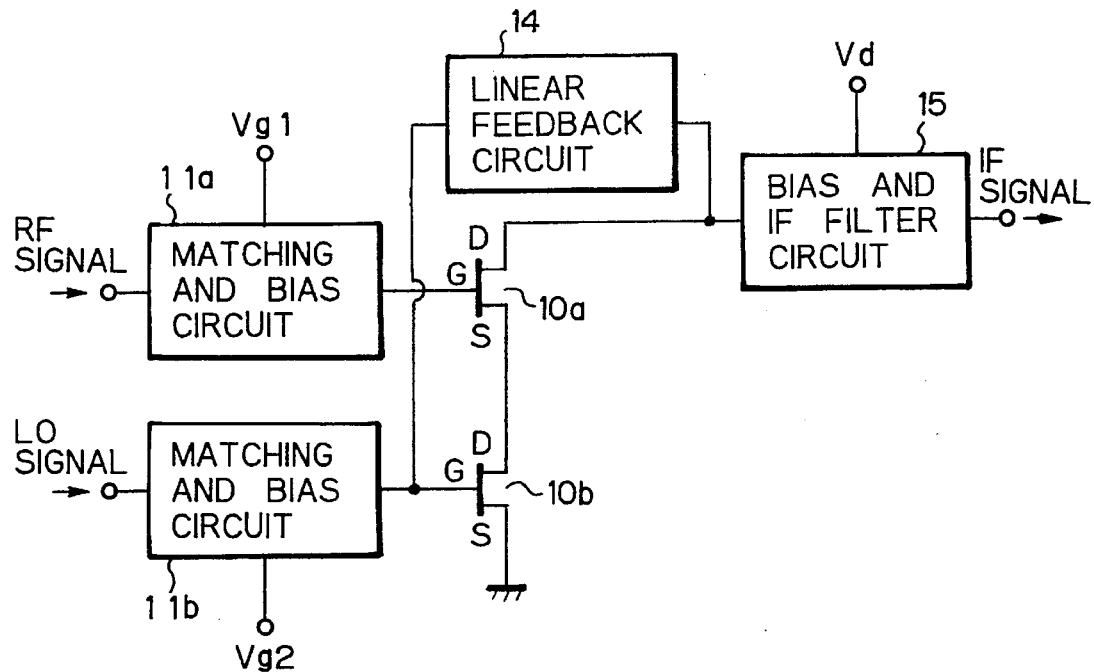
FIG. 15 schematically shows a further embodiment of a frequency conversion circuit according to the present invention.

FIG. 15 schematically shows a further embodiment of a frequency conversion circuit according to the present invention. The constitution of this frequency conversion circuit is the same as that of FIG. 14 except that the feedback operation is executed with respect to the LO signal instead of the RF signal. Namely, according to this embodiment, a linear feedback circuit 14 is directly connected across the drain electrode of the first transistor 10a and the gate electrode of the second transistor 10b so as to improve a linearity of the LO signal causing the IM distortion to decrease.

Thanks to such the linear feedback circuit 14 for feeding back not only the IF signal but also the RF and LO signals, the conversion circuit of this embodiment also can improve the relative IMR by 10 dB for the same conversion gain than that in the conventional mixer.

Figure 16:
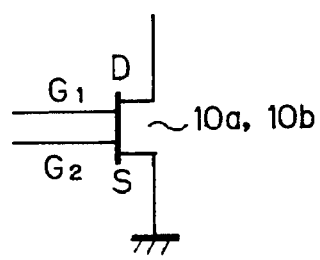
FIG. 16 shows a dual gate FET which is substitutable for the two FETs connected in series.

It is apparent that a dual gate GaAs FET shown in FIG. 16 can be substituted for the first and second FETs 10a and 10b connected with each other in series, in the embodiments of FIGS. 12 to 15.

Figure 17:
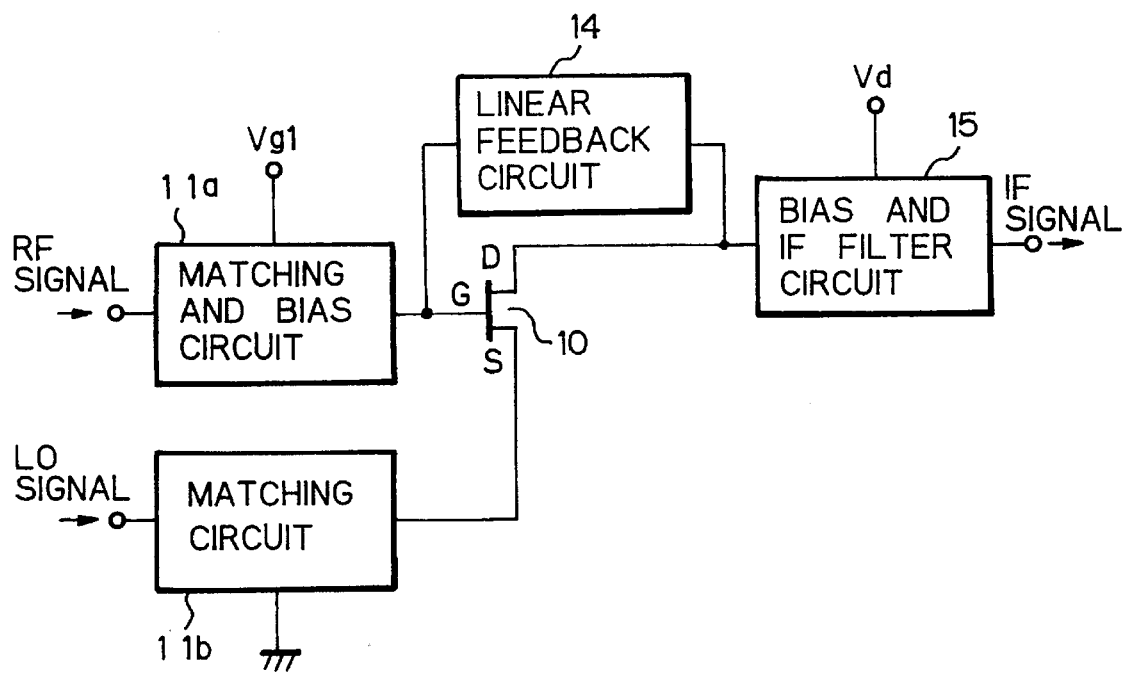
FIG. 17 schematically shows a still further embodiment of a frequency conversion circuit according to the present invention.

FIG. 17 schematically shows a still further embodiment of a frequency conversion circuit according to the present invention. The frequency conversion circuit of this embodiment is a source LO injection GaAs FET mixer receiving the RF signal at a gate of a GaAs FET with a grounded source as a frequency signal to be converted, mixing the LO signal injected into the source with the RF signal, and outputting the IF signal from a drain of the FET as a frequency converted signal. In FIG. 17, the same references are used for the same components as these in FIGS. 1 and 12.

The source electrode of the transistor 10 is grounded and is connected to a second matching and bias circuit 11b to receive the LO signal through this circuit 11b. The gate electrode of the transistor 10 is connected to a first matching and bias circuit 11a to receive the RF signal through this circuit 11a. Thus, the LO signal is mixed with the RF signal to obtain the IF signal. A bias and IF filter circuit 15 is connected to a drain electrode of the transistor 10. The obtained IF signal is output from the drain electrode of the transistor 10 through this circuit 15.

A linear feedback circuit 14 for feeding back not only the IF signal but also the RF and LO signals is directly connected across the drain electrode and the gate electrode of the transistor 10. The linear feedback circuit 14 in this embodiment can be constituted by any one of the various circuits shown in FIGS. 7a to 7f.

In this embodiment, the source electrode of the transistor 10 is directly grounded. However, in a modification, the source electrode may be indirectly grounded via a circuit element such as an inductor, capacitor or a level shift diode.

The frequency conversion circuit of this embodiment executes feedback operation with respect to the RF signal so as to improve a linearity of this RF signal causing the IM distortion to decrease. Due to such the linear feedback circuit 14 for feeding back not only the IF signal but also the RF and LO signals, the conversion circuit of this embodiment can improve the relative IMR by 10 dB for the same conversion gain than that in the conventional mixer.

Figure 18:
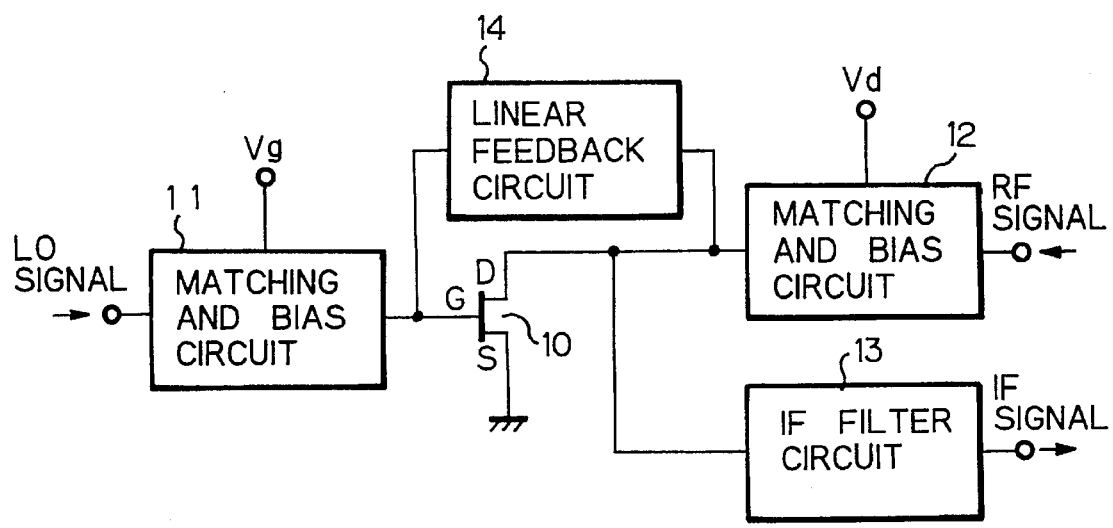
FIG. 18 schematically shows another embodiment of a frequency conversion circuit according to the present invention.

FIG. 18 schematically shows an another embodiment of a frequency conversion circuit according to the present invention. The frequency conversion circuit of this embodiment is a gate LO injection GaAs FET mixer receiving the LO signal at a gate of a GaAs FET with a grounded source, receiving the RF signal at its drain as a frequency signal to be converted, mixing the LO signal injected into the gate with the RF signal, and outputting the IF signal from the drain as a frequency converted signal. In FIG. 18, the same references are used for the same components as these in FIGS. 1 and 12.

The source electrode of the transistor 10 is grounded. The gate electrode is connected to a matching and bias circuit 11 to receive the LO signal through this circuit 11. The drain electrode of the transistor 10 is connected to an another matching and bias circuit 12 to receive the RF signal through this circuit 12. Thus, the LO signal its mixed with the RF signal to obtain the IF signal. An IF filter circuit 13 for passing the IF signal but for preventing the RF and LO signals is also connected to this drain electrode. The obtained IF signal is output from the drain electrode of the transistor 10 through this circuit 13.

A linear feedback circuit 14 for feeding back not only the IF signal but also the RF and LO signals is directly connected across the drain electrode and the gate electrode of the transistor 10. The linear feedback circuit 14 in this embodiment can be constituted by any one of the various circuits shown in FIGS. 7a to 7f.

In this embodiment, the source electrode of the transistor 10 is directly grounded. However, in a modification, the source electrode may be indirectly grounded via a circuit element such as an inductor, capacitor or a level shift diode.

Due to such the linear feedback circuit 14 for feeding back not only the IF signal but also the RF and LO signals, the conversion circuit of this embodiment can improve the relative IMR by 10 dB for the same conversion gain than that in the conventional mixer.

Figure 19:
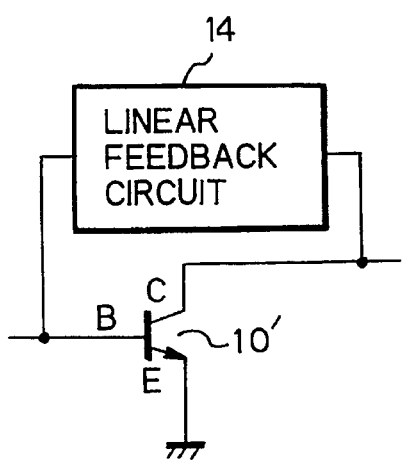
FIG. 19 shows a transistor portion in a further embodiment of a frequency conversion circuit according to the present invention.
Figure 20:
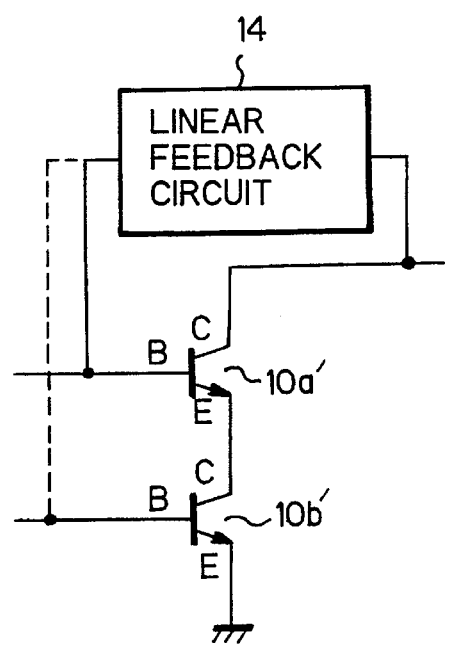
FIG. 20 shows a transistor portion in a still further embodiment of a frequency conversion circuit according to the present invention.

In the aforementioned embodiments, GaAs FET(s) are used for the transistor 10 and for the first and second transistors 10a and 10b. However, another kind of transistor(s) such as bipolar transistor(s) as shown in FIGS. 19 and 20 may be used. FIG. 19 shows a bipolar transistor 10' which can be utilized instead of the transistor 10 in the embodiments of FIGS. 1, 11, 17 and 18. FIG. 20 shows bipolar transistors 10a' and 10b' which can be utilized instead of the first and second transistors 10a and 10b in the embodiments of FIGS. 12 to 15.

Figure 21:
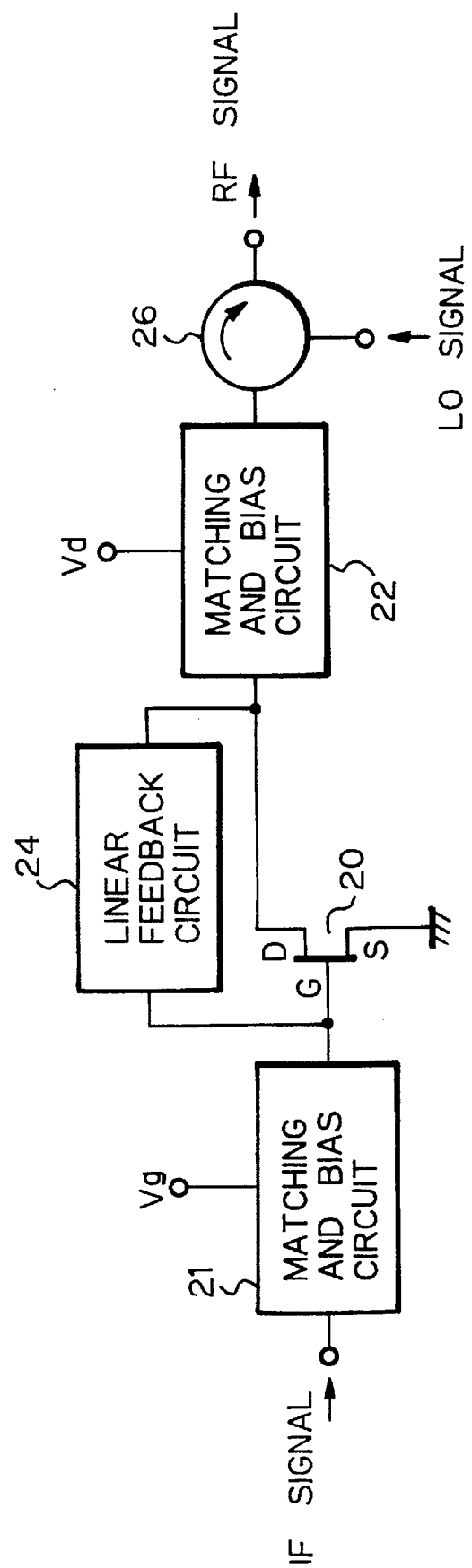
FIG. 21 schematically shows another embodiment of a frequency conversion circuit according to the present invention.

FIG. 21 schematically shows an another embodiment of a frequency conversion circuit according to the present invention. The frequency conversion circuit in this embodiment is an up-converter receiving the IF signal at its gate as a frequency signal to be converted, mixing the LO signal injected into its drain through a circulator with the IF signal and outputting the RF signal from the drain as a frequency converted signal.

In FIG. 21, a reference numeral 20 denotes a GaAs FET with a grounded source electrode. A matching and bias circuit 21 is connected with a gate electrode of the transistor 20. The IF signal is input into the transistor 20 through this circuit 21. Another matching and bias circuit 22 is connected with a drain electrode of the transistor 20. The circuit 22 is connected to a circulator 26 receiving the LO signal. Thus, the LO signal is input into the drain electrode of the transistor 20 through the circuit 22 and mixed with the IF signal to obtain the RF signal. The obtained RF signal is output through the circuit 22 and the circulator 26.

A linear feedback circuit 24 for feeding back not only the IF signal but also the RF and LO signals is directly connected across the drain electrode and the gate electrode of the transistor 20. The linear feedback circuit 24 in this embodiment is constituted by a capacitor and a resistor connected with each other in series as shown in FIG. 7a.

However, this feedback circuit 24 can be constituted by any one of the various circuits shown in FIGS. 7b to 7f.

The circulator 26 is provided to prevent the LO signal from leaking at an output terminal for the RF signal. However, if the frequency conversion circuit of this embodiment is designed in a balanced type, this circulator 26 can be omitted. Although the source electrode of the transistor 20 is directly grounded in this embodiment, the source electrode can be indirectly grounded via a circuit element such as an inductor, capacitor or a level shift diode.

Figure 22:
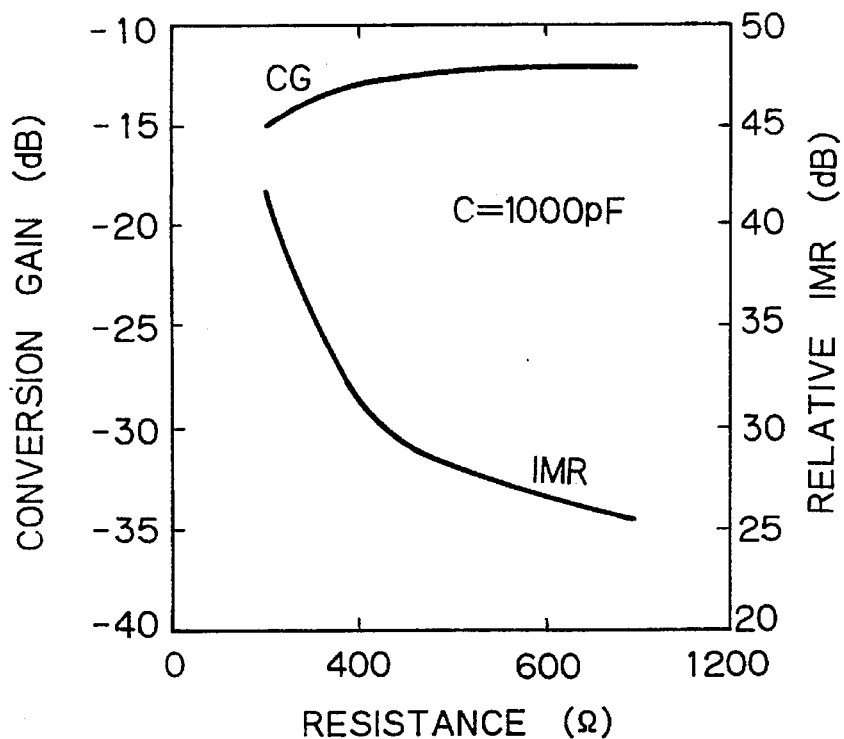
FIG. 22 shows a simulated conversion gain property and a simulated IMR property relative to that of no-feedback case, of the up-converter according to the embodiment shown in FIG. 21.

FIG. 22 shows a simulated conversion gain (CG) property and a simulated third-order IMR property relative to that of no-feedback case, of the up-converter according to this embodiment. For the simulation, it is supposed that the IF signal frequency is 250 MHz, the IF power level is −15 dB, the LO signal frequency is 1.65 GHz, the LO power level is 3 dBm, the gate bias is Vg=−0.6 V, the drain bias is Vd=0 V, and a feedback capacitance is 1000 pF.

For lower feedback resistance, the relative IMR continues to improve while the conversion gain is almost constant. A capacitance of greater than 1 pF will be necessary for lowering the IMR. If the power level of the LO signal at the drain is increased more than 3 dBm, particularly more than 5 dBm, a better linearity can be obtained resulting a more remarkable improvement of the third-order IM property without conversion gain fall off can be expected.

Figure 23:
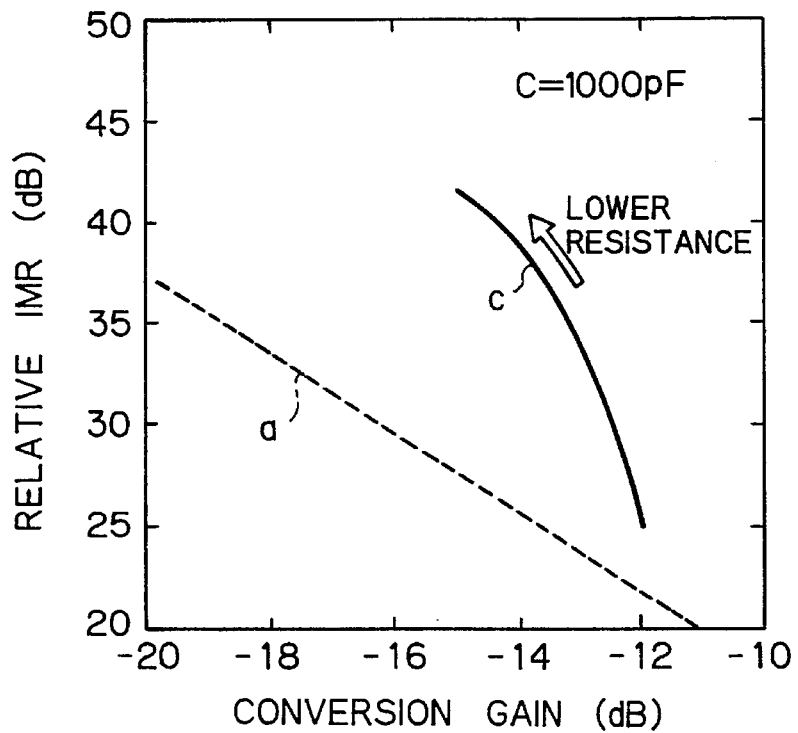
FIG. 23 shows the simulated result of FIG. 22 illustrating in a relationship of the relative IMR versus the conversion gain.

FIG. 23 shows the simulated result of FIG. 22 illustrating in a relationship of the relative IMR versus the conversion gain. In this figure, however, the relationship is represented in cases of no-feedback, and of feedback with capacitance of 1000 pF.

As shown by a linear broken line a in FIG. 23, the conventional converter has poor conversion gain because the dynamic range is broadened by increasing the gate width of the transistor without using a feedback circuit. However, as shown by a solid line c, the up-converter according to this embodiment with the linear feedback circuit can improve the relative IMR by 10 dB than the conventional converter which has the same conversion gain.

Figure 24:
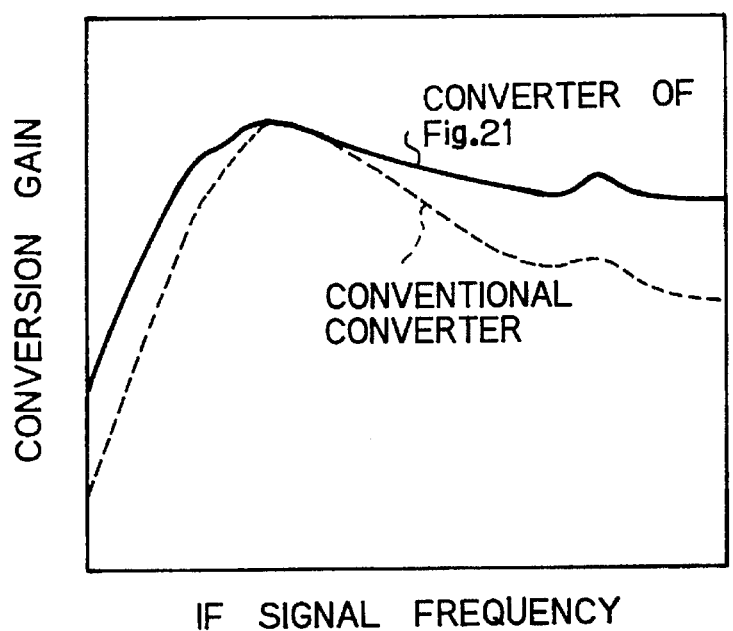
FIG. 24 shows a conversion gain versus IF signal frequency property of a converter according to the embodiment shown in FIG. 21 compared to a conventional converter.

FIG. 24 shows a conversion gain versus IF signal frequency property of the up-converter according to the embodiment shown in FIG. 21 compared to a conventional converter. Due to the linear feedback circuit 2 for feeding back not only the IF signal but also the RF and LO signals, the converter of this embodiment can attain gentler change of the conversion gain with respect to the IF signal frequency than that of the conventional converter, and thus can obtain a wider dynamic range.

Figure 25:
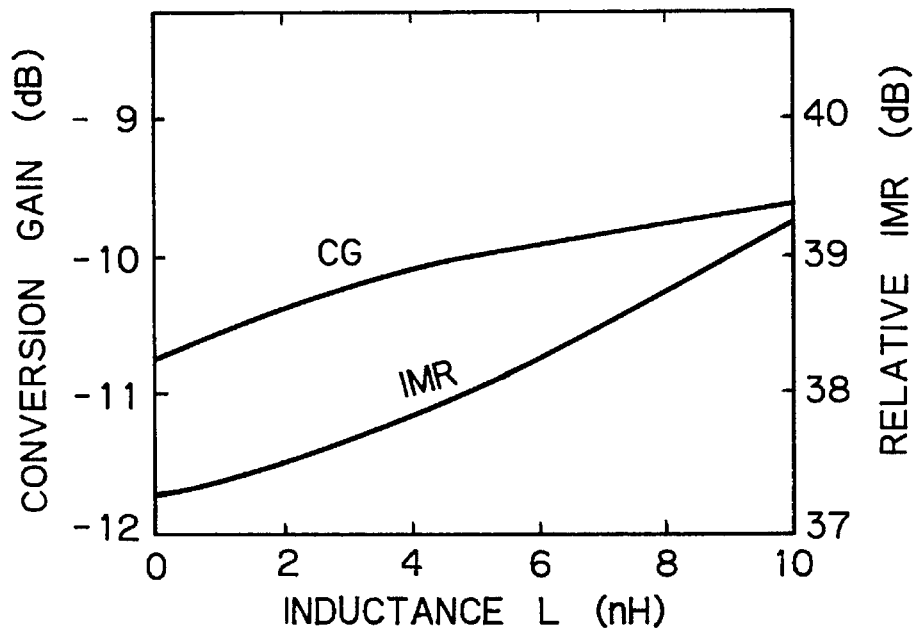
FIG. 25 shows simulated conversion gain and relative IMR versus inductance properties of the frequency conversion circuit using the feedback circuit shown in FIG. 7b.

FIG. 25 shows simulated conversion gain and relative IMR versus inductance properties of the up-converter using the feedback circuit shown in FIG. 7b. For the simulation, it is supposed that the IF signal frequency is 250 MHz, the IF power level is −15 dB, the LO signal frequency is 1.65 GHz, the LO power level is 3 dBm, the gate bias is Vg=−0.6 V, the drain bias is Vd=0 V, the feedback capacitance is 5 pF, and the feedback resistance is 600Ω.

For higher inductance L, both the conversion gain and the relative IMR are increased and a better IMR property than that of the feedback circuit of FIG. 7a can be obtained. Furthermore, although not shown, for higher inductance L, the noise figure decreases.

The linear feedback circuit shown in FIG. 7c can adjust the relative feedback amount and the relative phase of the RF, LO and IF signals by controlling the resistance and the inductance of the parallel circuit of the resistor 14d and the inductor 14e, which operate as a filter, so as to improve both the conversion gain and the relative IMR.

The linear feedback circuit shown in FIG. 7d can also improve the conversion gain and the relative IMR together by appropriately adjusting the capacitance and the inductance of the parallel circuit of the capacitor 14f and the inductor 14e.

The linear feedback circuit shown in FIG. 7e can also improve the conversion gain and the relative IMR together by appropriately adjusting the capacitance and the resistance of the parallel circuit of the capacitor 14f and the resistor 14d.

Figure 26:
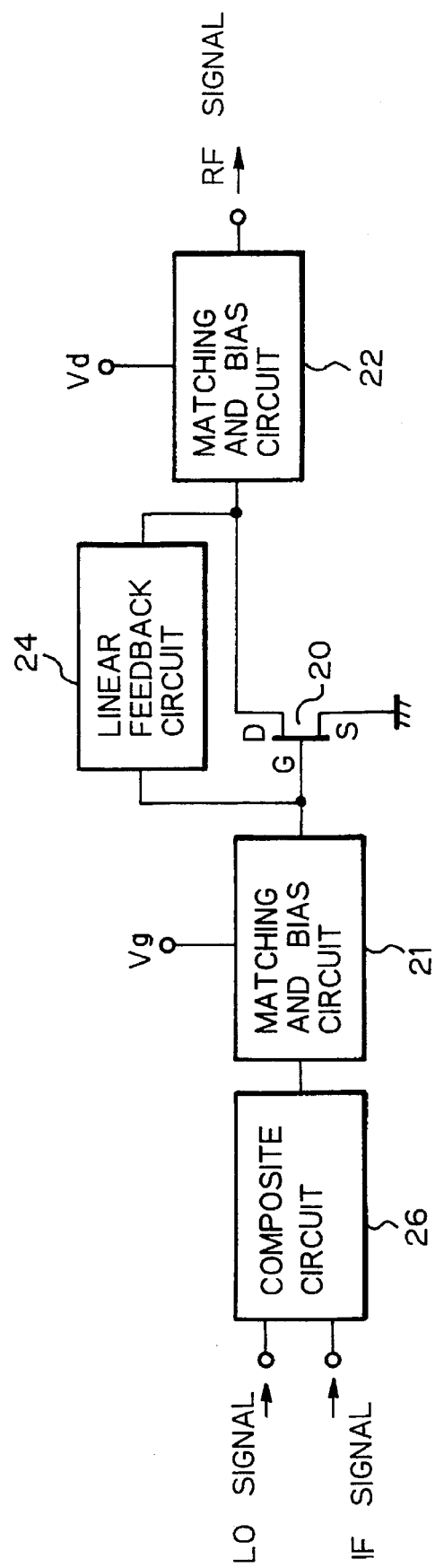
FIG. 26 schematically shows another embodiment of a frequency conversion circuit according to the present invention.

FIG. 26 schematically shows an another embodiment of a frequency conversion circuit according to the present invention. The frequency conversion circuit of this embodiment is a gate LO injection GaAs FET up-converter receiving the IF signal at its gate as a frequency signal to be converted, mixing the LO signal injected into the same gate with the IF signal and outputting the RF signal from a drain as a frequency converted signal. In FIG. 26, the same references are used for the same components as these in FIG. 21.

A matching and bias circuit 21 is connected to a gate electrode of a GaAs FET 20 having a grounded source electrode. A composite circuit 26 which can be constituted by a LANGE coupler or by an Wilkinson divider is connected to this circuit 21. The IF and LO signals are coupled by the composite circuit 26 and then input into the gate electrode of the transistor 20 through this circuit 21. Thus, the LO signal is mixed with the IF signal to obtain the RF signal. An another matching and bias circuit 22 is connected to a drain electrode of the transistor 20. The obtained RF signal is output from the drain electrode of the transistor 20 through this circuit 22.

A linear feedback circuit 24 for feeding back not only the IF signal but also the RF and LO signals is directly connected across the drain electrode and the gate electrode of the transistor 20. The linear feedback circuit 24 in this embodiment can be constituted by any one of the various circuits shown in FIGS. 7a to 7f.

In this embodiment, the source electrode of the transistor 20 is directly grounded. However, in a modification, the source electrode may be indirectly grounded via a circuit element such as an inductor, capacitor or a level shift diode.

Thanks to the linear feedback circuit for feeding back not only the IF signal but also the RF and LO signals, the up-converter of this embodiment can improve the relative IMR by 10 dB for the same conversion gain than that in the conventional up-converter.

Figure 27:
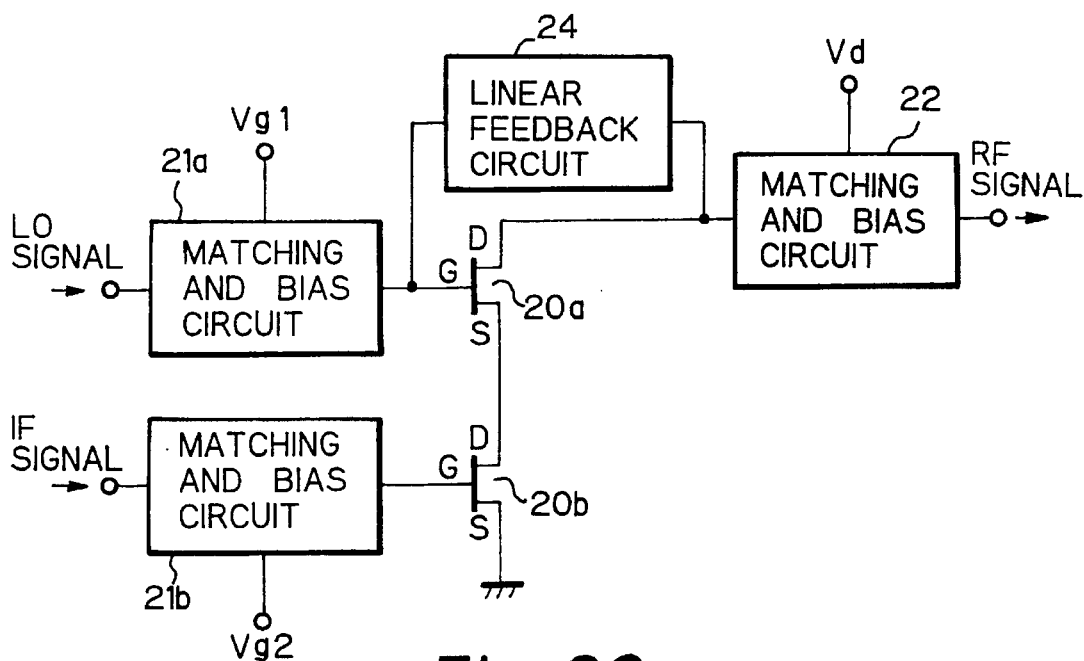
FIG. 27 schematically shows a further embodiment of a frequency conversion circuit according to the present invention.

FIG. 27 schematically shows a further embodiment of a frequency conversion circuit according to the present invention. The frequency conversion circuit of this embodiment is a gate LO injection GaAs FET up-converter receiving the IF signal at a gate of a second GaAs FET as a frequency signal to be converted, mixing the LO signal injected into a gate of a first GaAs FET with the IF signal, and outputting the RF signal from a drain of the first FET as a frequency converted signal. In FIG. 27, the same references are used for the same components as these in FIGS. 21 and 26.

The first and second GaAs FETs 20a and 20b are connected with each other in series. Namely, a source electrode of the first transistor 20a is connected to a drain electrode of the second transistor 20b. A source electrode of the second transistor 20b is grounded. The gate electrode of this second transistor 20b is connected to a second matching and bias circuit 21b and receives the IF signal through this circuit 21b. The gate electrode of the first transistor 20a is connected to a first matching and bias circuit 21a and receives the LO signal through this circuit 21a. Thus, the LO signal is mixed with the IF signal to obtain the RF signal. A third matching and bias circuit 22 is connected to a drain electrode of the first transistor 20a. The obtained RF signal is output from the drain electrode of the first transistor 20a through this circuit 22.

A linear feedback circuit 24 for feeding back not only the IF signal but also the RF and LO signals is directly connected across the drain electrode of the first transistor 20a and its gate electrode. The linear feedback circuit 24 in this embodiment can be constituted by any one of the various circuits shown in FIGS. 7a to 7f.

In this embodiment, the source electrode of the second transistor 20b is directly grounded. However, in a modification, the source electrode may be indirectly grounded via a circuit element such as an inductor, capacitor or a level shift diode.

The up-converter of this embodiment executes feedback operation with respect to the LO signal so as to improve a linearity of this LO signal causing the IM distortion to decrease. Due to such the linear feedback circuit 24 for feeding back not only the IF signal but also the RF and LO signals, the up-converter of this embodiment can improve the relative IMR by 10 dB for the same conversion gain than that in the conventional up-converter.

Figure 28:
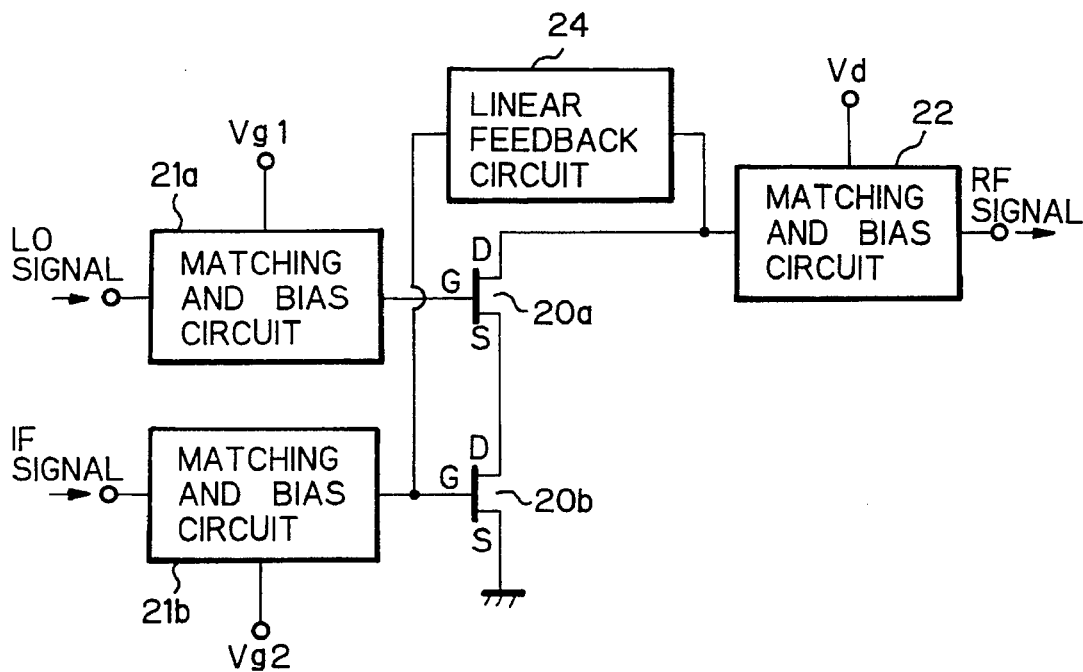
FIG. 28 schematically shows a still further embodiment of a frequency conversion circuit according to the present invention.

FIG. 28 schematically shows a still further embodiment of a frequency conversion circuit according to the present invention. The constitution of this frequency conversion circuit is the same as that of FIG. 27 except that the feedback operation is executed with respect to the IF signal instead of the LO signal. Namely, according to this embodiment, a linear feedback circuit 24 is directly connected across the drain electrode of the first transistor 20a and the gate electrode of the second transistor 20b so as to improve a linearity of the IF signal causing the IM distortion to decrease.

Due to such the linear feedback circuit 24 for feeding back not only the IF signal but also the RF and LO signals, the up-converter of this embodiment also can improve the relative IMR by 10 dB for the same conversion gain than that in the conventional up-converter.

Figure 29:
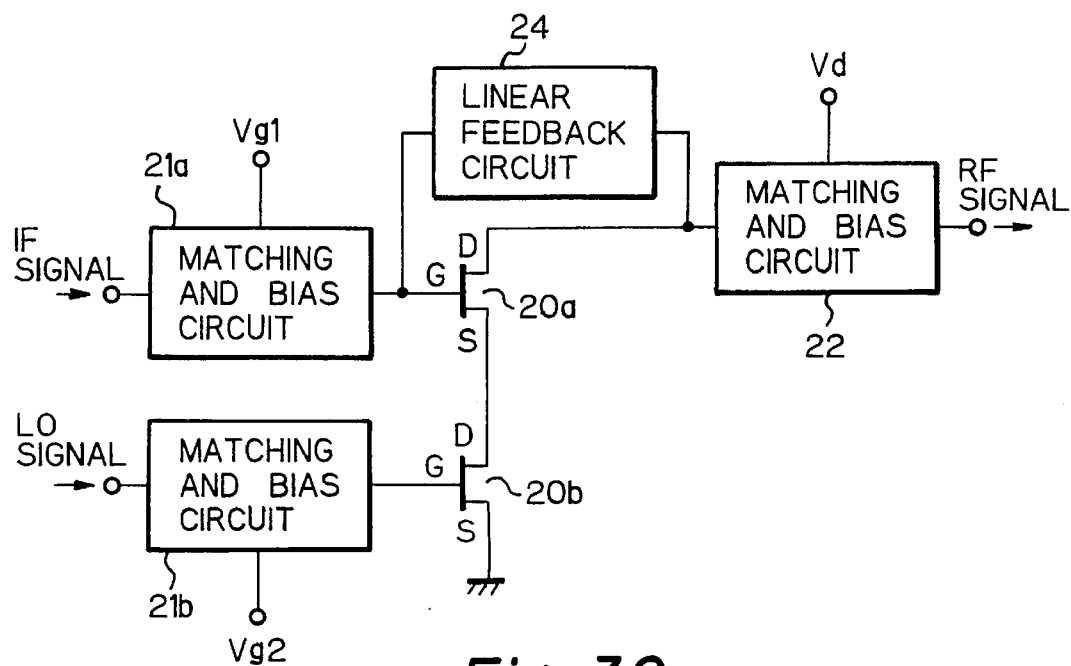
FIG. 29 schematically shows another embodiment of a frequency conversion circuit according to the present invention.

FIG. 29 schematically shows an another embodiment of a frequency conversion circuit according to the present invention. The frequency conversion circuit of this embodiment is a gate LO injection GaAs FET up-converter receiving the IF signal at a gate of a first GaAs FET as a frequency signal to be converted, mixing the LO signal injected into a gate of a second GaAs FET with the IF signal, and outputting the RF signal from a drain of the first FET as a frequency converted signal. In FIG. 29, the same references are used for the same components as these in FIGS. 21 and 26.

The first and second GaAs FETs 20a and 20b are connected with each other in series. Namely, a source electrode of the first transistor 20a is connected to a drain electrode of the second transistor 20b. A source electrode of the second transistor 20b is grounded. The gate electrode of this second transistor 20b is connected to a second matching and bias circuit 21b and receives the LO signal through this circuit 21b. The gate electrode of the first transistor 20a is connected to a first matching and bias circuit 21a and receives the IF signal through this circuit 21a. Thus, the LO signal is mixed with the IF signal to obtain the RF signal. A third matching and bias circuit 22 is connected to a drain electrode of the first transistor 20a. The obtained RF signal is outputted from the drain electrode of the first transistor 20a through this circuit 22.

A linear feedback circuit 24 for feeding back not only the IF signal but also the RF and LO signals is directly connected across the drain electrode of the first transistor 20a and its gate electrode. The linear feedback circuit 24 in this embodiment can be constituted by any one of the various circuits shown in FIGS. 7a to 7f.

In this embodiment, the source electrode of the second transistor 20b is directly grounded. However, in a modification, the source electrode may be indirectly grounded via a circuit element such as an inductor, capacitor or a level shift diode.

The up-converter of this embodiment executes feedback operation with respect to the IF signal so as to improve a linearity of this IF signal causing the IM distortion to decrease. Due to such the linear feedback circuit 24 for feeding back not only the IF signal but also the RF and LO signals, the up-converter of this embodiment can improve the relative IMR by 10 dB for the same conversion gain than that in the conventional up-converter.

Figure 30:
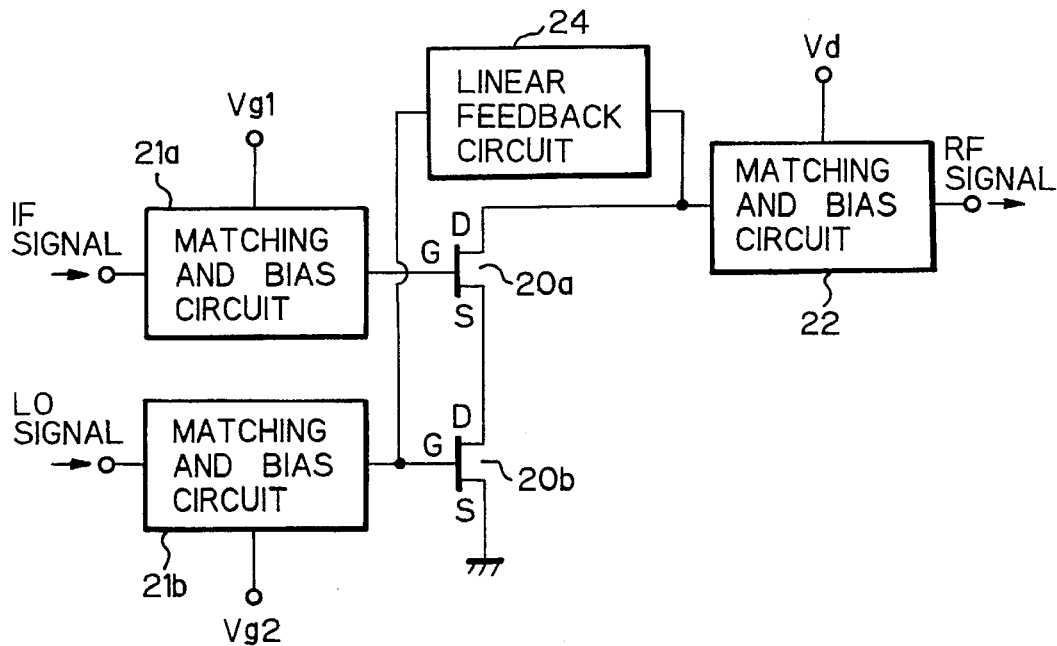
FIG. 30 schematically shows a further embodiment of a frequency conversion circuit according to the present invention.

FIG. 30 schematically shows a further embodiment of a frequency conversion circuit according to the present invention. The constitution of this frequency conversion circuit is the same as that of FIG. 29 except that the feedback operation is executed with respect to the LO signal instead of the IF signal. Namely, according to this embodiment, a linear feedback circuit 24 is directly connected across the drain electrode of the first transistor 20a and the gate electrode of the second transistor 20b so as to improve a linearity of the LO signal causing the IM distortion to decrease.

Due to such the linear feedback circuit 24 for feeding back not only the IF signal but also the RF and LO signals, the up-converter of this embodiment also can improve the relative IMR by 10 dB for the same conversion gain than that in the conventional up-converter.

It is apparent that a dual gate GaAs FET shown in FIG. 16 can be substituted for the first and second FETs 20a and 20b connected with each other in series, in the embodiments of FIGS. 27 to 30.

Figure 31:
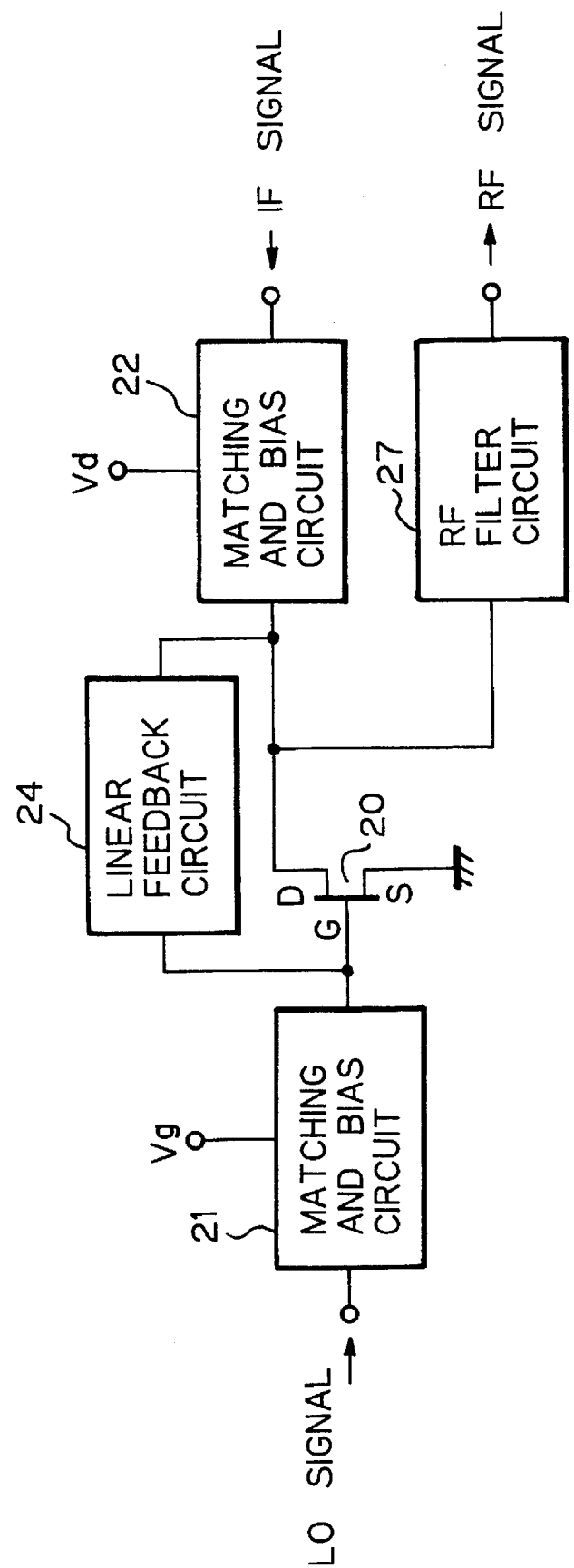
FIG. 31 schematically shows a still further embodiment of a frequency conversion circuit according to the present invention.

FIG. 31 schematically shows a still further embodiment of a frequency conversion circuit according to the present invention. The frequency conversion circuit of this embodiment is a gate LO injection GaAs FET up-converter receiving the LO signal at a gate of a GaAs FET with a grounded source, receiving the IF signal at its drain as a frequency signal to be converted, mixing the LO signal injected into the gate with the IF signal, and outputting the RF signal from the drain as a frequency converted signal. In FIG. 31, the same references are used for the same components as these in FIGS. 21 and 26.

The source electrode of the transistor 20 is grounded. The gate electrode is connected to a matching and bias circuit 21 to receive the LO signal through this circuit 21. The drain electrode of the transistor 20 is connected to an another matching and bias circuit 22 to receive the IF signal through this circuit 22. Thus, the LO signal is mixed with the IF signal to obtain the RF signal. An RF filter circuit 27 for passing the RF signal but for preventing the IF and LO signals is also connected to this drain electrode. The obtained RF signal is output from the drain electrode of the transistor 20 through this circuit 27.

A linear feedback circuit 24 for feeding back not only the IF signal but also the RF and LO signals is directly connected across the drain electrode and the gate electrode of the transistor 20. The linear feedback circuit 24 in this embodiment can be constituted by any one of the various circuits shown in FIGS. 7a to 7f.

In this embodiment, the source electrode of the transistor 20 is directly grounded. However, in a modification, the source electrode may be indirectly grounded via a circuit element such as an inductor, capacitor or a level shift diode.

Thanks to such the linear feedback circuit 24 for feeding back not only the IF signal but also the RF and LO signals, the up-converter of this embodiment can improve the relative IMR by 10 dB for the same conversion gain than that in the conventional up-converter. It should be noted that the constitution of this embodiment is effective in case where the frequency of the LO and RF signals is around several hundreds MHz to 2 GHz.

In the aforementioned embodiments, GaAs FET(s) are used for the transistor 20 and for the first and second transistors 20a and 20b. However, another kind of transistor(s) such as bipolar transistor(s) as shown in FIGS. 19 and 20 may be used. FIG. 19 shows a bipolar transistor which can be utilized instead of the transistor 20 in the embodiments of FIGS. 21, 26 and 31. FIG. 20 shows two bipolar transistors which can be utilized instead of the first and second transistors in the embodiments of FIGS. 27 to 30.

As will be apparent from the above-mentioned embodiments, the frequency conversion circuit according to the present invention can extremely improve the IM property without reducing conversion gain and noise figure in comparison with a conventional conversion circuit, with a simple structure wherein a linear feedback circuit for feeding back at least the RF signal and the LO signal is connected between a drain electrode and a gate electrode of at least one transistor. In other words, the present invention can attain an improved third-order IM property which would be obtained according to the conventional technique by increasing the effective gate width of the FET more than eight times without reducing conversion gain. Thus, a conversion circuit with lower power dissipation and smaller size can easily realized.

The present invention had been developed for mixers and for up-converters used in mobile front end stages in a personal handy phone system (PHS) in Japan. However, since the cellular system such as AMPS (USA), GSM (Europe), JUDCRS (Japan), IS-54 (North America) and GSM (Great Britain) and the cordless system such as PHS (Japan), CT2 (Europe) and DECT (Europe) employ P to S bands, low-distortion frequency conversion circuits according to the present invention can be effectively applied to these various mobile communication systems.

Many widely different embodiments of the present invention may be constructed without departing from the spirit and scope of the present invention. It should be understood that the present invention is not limited to the specific embodiments described in the specification, except as defined in the appended claims.

What is claimed is:

1. A frequency conversion circuit comprising:

at least one transistor with an input terminal and an output terminal, one of (a) a frequency signal to be converted and (b) a local oscillator signal being input to said input terminal, a converted frequency signal being output from said output terminal; and a linear feedback circuit for feeding back at least one of (a) a radio frequency signal and (b) the local oscillator signal to improve linear property, said linear feedback circuit being directly connected across said input and output terminals.

2. A frequency conversion circuit as claimed in claim 1, wherein said frequency conversion circuit includes a single FET with a gate electrode operating as said input terminal and a drain electrode operating as said output terminal, and wherein said linear feedback circuit is directly connected across said gate and drain electrodes.

3. A frequency conversion circuit as claimed in claim 2, wherein said frequency signal to be converted is a radio frequency signal and said converted frequency signal is an intermediate frequency signal.

4. A frequency conversion circuit as claimed in claim 3, wherein the radio frequency signal is input to said gate electrode and the local oscillator signal is input to said drain electrode.

5. A frequency conversion circuit as claimed in claim 3, wherein said FET has a source electrode, and wherein the local oscillator signal is input to said source electrode.

6. A frequency conversion circuit as claimed in claim 3, wherein the radio frequency signal is input to said drain electrode and the local oscillator signal is input to said gate electrode.

7. A frequency conversion circuit as claimed in claim 3, wherein said frequency conversion circuit further includes a composite circuit coupled to said gate electrode, and wherein the radio frequency signal and the local oscillator signal are input to said gate electrode via said composite circuit.

8. A frequency conversion circuit as claimed in claim 2, wherein said frequency signal to be converted is an intermediate frequency signal and said converted frequency signal is a radio frequency signal.

9. A frequency conversion circuit as claimed in claim 8, wherein the intermediate frequency signal is input to said gate electrode.

10. A frequency conversion circuit as claimed in claim 8, wherein the local oscillator signal is input to said gate electrode.

11. A frequency conversion circuit as claimed in claim 8, wherein said frequency conversion circuit further includes a composite circuit coupled to said gate electrode, and wherein the intermediate frequency signal and the local oscillator signal are input to said gate electrode via said composite circuit.

12. A frequency conversion circuit as claimed in claim 1, wherein said frequency conversion circuit includes a single bipolar transistor with a base electrode operating as said input terminal and a collector electrode operating as said output terminal, wherein said linear feedback circuit is directly connected across said base and collector electrodes.

13. A frequency conversion circuit as claimed in claim 1, wherein said frequency conversion circuit includes two FETs connected with each other in series, each of said FETs having a gate electrode and a drain electrode, wherein the frequency signal to be converted is input to the gate electrode of one of said FETs and the local oscillator signal is input to the gate electrode of the other one of said FETs, and wherein said linear feedback circuit is directly connected across the gate electrode of one of said FETs and the drain electrode of said one of said FETs.

14. A frequency conversion circuit as claimed in claim 13, wherein said frequency signal to be converted is a radio frequency signal and said converted frequency signal is an intermediate frequency signal.

15. A frequency conversion circuit as claimed in claim 13, wherein said frequency signal to be converted is an intermediate frequency signal and said converted frequency signal is a radio frequency signal.

16. A frequency conversion circuit as claimed in claim 1, wherein said frequency conversion circuit includes a single dual gate FET with two gate electrodes and a drain electrode, wherein the frequency signal to be converted is input to one of said gate electrodes and the local oscillator signal is input to the other one of said gate electrodes, and wherein said linear feedback circuit is directly connected across said drain electrode and one of said gate electrodes.

17. A frequency conversion circuit as claimed in claim 1, wherein said frequency conversion circuit includes two bipolar transistors connected with each other in series, each of said bipolar transistors having a base electrode and a collector electrode, wherein the frequency signal to be converted is input to the base electrode of one of said bipolar transistors and the local oscillator signal is inputted to the base electrode of the other one of said bipolar transistors, and wherein said linear feedback circuit is directly connected across the base electrode of one of said bipolar transistors and the collector electrode of one of said bipolar transistors.

18. A frequency conversion circuit as claimed in claim 1, wherein said linear feedback circuit includes a series circuit of a capacitor and a resistor.

19. A frequency conversion circuit as claimed in claim 18, wherein said resistor is a fixed resistance resistor.

20. A frequency conversion circuit as claimed in claim 18, wherein said resistor is a variable resistance resistor.

21. A frequency conversion circuit as claimed in claim 18, wherein said linear feedback circuit includes an inductor connected with said series circuit of a capacitor and a resistor in series.

22. A frequency conversion circuit as claimed in claim 18, wherein said linear feedback circuit includes a capacitor connected with said series circuit of a capacitor and a resistor in series.

* * * * *